US007185265B2

(12) United States Patent
Kakuta et al.

(10) Patent No.: US 7,185,265 B2
(45) Date of Patent: Feb. 27, 2007

(54) DISK ARRAY SYSTEM AND ITS CONTROL METHOD

(75) Inventors: Hitoshi Kakuta, Tokyo (JP); Yoshifumi Takamoto, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 207 days.

(21) Appl. No.: 10/388,634

(22) Filed: Mar. 17, 2003

(65) Prior Publication Data

US 2003/0135808 A1    Jul. 17, 2003

Related U.S. Application Data

(63) Continuation of application No. 09/862,608, filed on May 23, 2001, now Pat. No. 6,557,140, which is a continuation of application No. 09/444,562, filed on Nov. 19, 1999, now Pat. No. 6,256,749, which is a continuation of application No. 08/626,332, filed on Apr. 2, 1996, now Pat. No. 6,049,890, which is a continuation of application No. 08/248,452, filed on May 24, 1994, now Pat. No. 5,579,474, which is a continuation-in-part of application No. 08/173,557, filed on Dec. 22, 1993, now Pat. No. 5,621,882.

(30) Foreign Application Priority Data

Dec. 28, 1992  (JP)  .................................... 4-348301
May 27, 1993  (JP)  .................................... 5-125766

(51) Int. Cl.
*G11C 29/00* (2006.01)
*G06F 11/00* (2006.01)

(52) U.S. Cl. ........................... 714/769; 714/718; 714/6

(58) Field of Classification Search ................ 714/763, 714/769, 6, 718; 365/200
See application file for complete search history.

(56) References Cited

U.S. PATENT DOCUMENTS 4,870,643 A *  9/1989  Bultman et al.
5,124,987 A *  6/1992  Milligan et al.
5,155,835 A * 10/1992  Belsan ....................... 711/114

(Continued)

FOREIGN PATENT DOCUMENTS

JP          58-181162         10/1983

(Continued)

OTHER PUBLICATIONS

D. Patterson et al, "A Case for Redundant Arrays of Inexpensive Disks (RAID)", in ACM SIGMOD Conference, Chicago, IL, Jun. 1988.

(Continued)

*Primary Examiner*—Phung My Chung
(74) *Attorney, Agent, or Firm*—Mattingly, Stanger, Malur & Brundidge, P.C.

(57) ABSTRACT

In a disk array system of RAID (level 5) improving the system performance by distributing data, duplicated fields are allocated in a parity group in order to reduce an overhead of data write. In the data write process, write data is tentatively and duplicately written in the duplicate fields. At this time, a write completion is reported to CPU. The parity is generated later at a proper timing and written in a SCSI drive. Generating a parity and writing data can be efficiently scheduled.

8 Claims, 15 Drawing Sheets

U.S. PATENT DOCUMENTS

| | | | |
|---|---|---|---|
| 5,263,145 A | * | 11/1993 | Brady et al. |
| 5,274,799 A | * | 12/1993 | Brant et al. ............... 714/6 |
| 5,309,451 A | * | 5/1994 | Noya et al. |
| 5,392,244 A | * | 2/1995 | Jacobson et al. ......... 711/114 |
| 5,499,337 A | * | 3/1996 | Gordon ..................... 714/6 |
| 5,655,150 A | | 8/1997 | Matsumoto et al. |
| 6,049,890 A | * | 4/2000 | Kakuta et al. ............. 714/6 |
| 6,154,854 A | * | 11/2000 | Stallmo ..................... 714/6 |
| 6,289,471 B1 | * | 9/2001 | Gordon ..................... 714/6 |

FOREIGN PATENT DOCUMENTS

| | | |
|---|---|---|
| JP | 63-157365 | 6/1988 |
| JP | 1-316041 | 12/1989 |
| JP | 4-127224 | 4/1992 |
| JP | 4-230512 | 8/1992 |
| JP | 04-279924 | 10/1992 |
| JP | 4-296926 | 10/1992 |
| JP | 4-312146 | 11/1992 |
| JP | 5-035413 | 2/1993 |
| JP | 5-54546 | 3/1993 |
| JP | 5-94224 | 4/1993 |
| JP | 5-100960 | 4/1993 |
| JP | 05-127837 | 5/1993 |
| JP | 5-19632 | 1/1994 |
| WO | 91/20076 | 12/1991 |
| WO | 92/12482 | 7/1992 |

OTHER PUBLICATIONS

"Nikkei Watcher IBM Version", Sep. 14, 1992, pp. 14-15.

"Hybrid Reducdancy [sic] Direct-Access Storage Device Array with Design Options"; IBM Technical Bulletin, vol. 37, No. 02B, Feb. 1994, pp. 141-148.

"Using Dual Actuator Shared Data Direct Access Storage Devices Drives in a Redundant Array"; IBM Technical Disclosure Bulletin, vol. 33, No. 8, Jan. 1991, pp. 270-272.

* cited by examiner

D: DATA   P: PARITY   S: SPACE

| | SD #1 | SD #2 | SD #3 | SD #4 | SD #5 | SD #6 |
|---|---|---|---|---|---|---|
| D ADR1 | D #1 | D #2 | D #3 | S | S | P #1 |
| D ADR2 | S | D #4 | D #5 | D #6 | S | P #2 |
| D ADR3 | P #3 | D | D #7 | D #8 | D #9 | S |
| D ADR4 | S | P #4 | S | D #10 | D #11 | D #12 |
| D ADR5 | D #13 | S | P #5 | S | D #14 | D #15 |
| D ADR6 | D #16 | D #17 | S | P #6 | S | D #18 |
| D ADR7 | D #19 | D #20 | S | S | D #21 | P #7 |
| D ADR8 | D #22 | D #23 | D #24 | P #8 | S | S |

(WRITE PROCESS)

BEFORE WRITING OF PARTY NP # 1 TO SCSI DRIVE OF SD # 6 (4)

AFTER WRITING OF PARTY NP # 1 TO SCSI DRIVE OF SD # 6 (4)

| CPU DESIGNATED ADDRESS 41 | | 46 | 61 | 47 60 | 48 |
|---|---|---|---|---|---|
| CPU DESIGNATED DRIVE NO. | | CCHHR | LOGICAL GROUP ADDRESS | CACHE ADDRESS | CACHE FLAG |
| DRIVE # 1 | | ADR 1 | LADR 1 | — | — |
| | | ADR 2 | LADR 3 | — | — |
| | | ADR 3 | LADR 8 | — | — |
| | | ⋮ | ⋮ | ⋮ | ⋮ |
| DRIVE # 2 | | ADR 1 | LADR 2 | — | 0 |
| | | ADR 2 | LADR 1 | CADR 1,5 | 1 |
| | | ADR 3 | LADR 5 | CADR 1,8 | 1 |
| | | ADR 4 | LADR 4 | CADR 1,6 | 1 |
| | | ⋮ | ⋮ | ⋮ | ⋮ |

*FIG. 10*

DISK ARRAY SYSTEM AND ITS CONTROL METHOD

This is a continuation application of U.S. Ser. No. 09/862,608, filed May 23, 2001 now U.S. Pat. No. 6,357,140, which is continuation application of U.S. Ser. No. 09/444,562, filed on Nov. 19, 1999 (U.S. Pat. No. 6,256,749), which is a continuation application of U.S. Ser. No. 08/626,332, filed on Apr. 2, 1996 (U.S. Pat. No. 6,049,890), which is a continuation application of U.S. Ser. No. 08/248,452, filed May 24, 1994 (U.S. Pat. No. 5,579,474), which is a continuation-in-part of application Ser. No. 08/173,557 filed Dec. 22, 1993 (U.S. Pat. No. 5,621,882) the subject matter of which is incorporated herein by reference.

CROSS-REFERENCE TO RELATED APPLICATIONS

This is a Continuation-in-part of application Ser. No. 08/173,557 filed Dec. 22, 1993 the subject matter of which is incorporated herein by reference.

This application is related to U.S. application Ser. No. 07/979,275 filed Nov. 20, 1992 and Ser. No. 08/034,389 filed Mar. 18, 1993 and U.S. application entitled "FILE DATA MULTIPLEXING METHOD AND DATA PROCESSING SYSTEM" based on Japanese patent application No. 5-125773 filed May 27, 1993, the contents of which are incorporated herein by reference.

BACKGROUND OF THE INVENTION

The present invention relates to a computer system, and more particularly to a disk file system capable of providing a high performance of input/output operation.

In present computer systems, data requested from by a higher hierarchy such as a CPU is stored in a secondary storage. When it becomes necessary, CPU reads data from, or writes data to, the secondary storage. A non-volatile storage medium such as a magnetic recording medium and an optical disk, typically a disc drive (hereinafter simply called a drive), is used as such a secondary storage.

In a computer system, a secondary storage of high performance has been desired because information processing technology has recently become highly sophisticated. As one of solutions for this, a disk array has been proposed which is constructed of a number of relatively small capacity drives.

Reports on the performance and reliability of disk arrays (levels 3 and 5) are presented in "A Case for Redundant Arrays of Inexpensive Disks (RAID)", by D. Patterson, G. Gibson, and R. H. Kartz, at pp. 109–116, June, 1988. In the disk array (level 3), data is divided and processed in parallel, and in the disk array (level 5), data is distributed and processed independently. A disk array written in this paper is presently considered to be a most general disk array.

A disk array (level 5) will be described in which data is distributed and processed independently. In the level 5 disk array, data is not divided but distributively stored in a number of relatively small capacity drives and processed independently. A secondary storage of a mainframe system presently used is generally a drive having a large capacity. It occurs therefore frequently that while the drive is used by one read/write request, another request is required to stand by until the first request is completely processed. Instead of the large capacity drive used as the secondary storage of a mainframe system, a level 5 disk array uses a number of relatively small capacity drives. It is therefore possible to deal with an increased number of read/write requests because the disk array has a number of drives, thereby shortening a wait time of each read/write request. However, the disk array has a number of disks and hence a number of components so that a possibility of failures increases. To improve reliability, it becomes necessary to use parities.

Data stored in a failed drive can be rebuilt by using parities. A parity is generated from corresponding data and stored in a drive of the disk array, and the data are stored in different drives of the disk array.

Like a presently used general mainframe system, the storage location (address) of data in a disk array of the secondary storage is fixed and CPU accesses this fixed address for data read/write. International Patent WO 91/20076 discloses a method of dynamically translating a write address in units of track for the basic architecture of the level 5 wherein a table of dynamically changeable addresses is provided and compressed data is written.

JP-A-4-230512 discloses a method of writing data and a correspondingly changed parity into different locations of a level 5 disk array. IBM Corp. has announced a level 5 disk array (9337) provided with a WAD (write assist device) (refer to "Nikkei Watcher, IBM Version", 1992 Sep. 14 issue, pp. 14–15.

SUMMARY OF THE INVENTION

In a presently used general mainframe system or other systems, the storage location (address) of data in a drive of a secondary storage is fixed and CPU accesses this fixed address for data read/write. A disk array also uses fixed addresses. Fixed addresses pose no problem in the case of a disk array (level 3) in which data is divided and processed in parallel. However, in the case of a disk array (level 5) in which data is distributed and processed independently, fixed addresses result in a large overhead of data write. This will be clarified in the following.

FIG. 11 is a schematic diagram explaining the structure of a RAID of the level 5 in which data is distributed and processed independently, and which has been proposed by D. Patterson and et. al in the above cited paper. Data at each address is a unit processed by one read/write operation, and is independent from other data. In the architecture of RAID, each address of data is fixed. As described earlier, it is essential for this system to use parities in order to improve the system reliability. In this system, a parity is formed from data at the same address of respective drives. For example, a parity is formed from data at the address (1, 1) of the drives #1 to #4 and stored in a parity drive #5 at the address (1, 1). Like a presently used mainframe system, data is accessed from a corresponding drive of this system.

For example, in updating data in the drive #3 at the address (2, 2) of this disk array, the data before update in the drive #3 at the address (2, 2) and the corresponding parity in the drive #5 at the address (2, 2) are first read (indicated by (1)). A new parity is formed from an exclusive logical sum of the read data and new update data (indicated by (2)). After the new parity is formed, the new update data is stored in the drive #3 at the address (2, 2) and the new parity is stored in the drive #5 at the address (2, 2).

As shown in FIG. 12A, the old data and parity are read from the corresponding drives of the level 5 disk array by waiting for half a revolution of drives in average, and then a new parity is calculated. Another one revolution is required to write this new parity, resulting in one and a half revolution in total at a minimum for updating data. A wait time of one and a half revolution is a very large overhead of drives. A method of dynamically translating a write address so as to reduce a data write overhead is disclosed in the above-cited WO 91/20076.

Also disclosed in the above-cited JP-A-4-230512 is a method of writing data in a drive at an address different from the write address in order to reduce a data write overhead. Immediately after the write data is sent from CPU, a parity is updated and written in a drive. As compared to data read, an overhead of generating and wiring a parity is very large. As a result, if CPU requests a large number of read/write requests, a large overhead of dealing with the requests becomes a main factor of lowering the system performance.

It is an object of the present invention to reduce a data write overhead and improve the performance of a level 5 disk array system.

It is another object of the present invention to effectively use drive resources by improving the system performance by a spare drive which rebuilds data in a failed drive.

According to the present invention, a logical group is constituted by drives of a parity group and duplicated fields (space fields). By using the space fields efficiently, a parity update process in the write process can be delayed, and the parity can be generated later when the number of read/write requests by CPU reduces, while maintaining a high reliability.

Specifically, in the write process, data to be written (new data) is duplicately stored in the space fields of the SCSI drives 12 constituting a logical group 12. At this time, a tentative write completion is reported to CPU.

Generating a parity and writing it in a SCSI drive 12 is performed at a timing independent from the timing of writing new data into the SCSI drives 12. Specifically, MP1 20 of ADC 2 counts the number of read/write requests by CPU relative to the logical group 10. If the number is smaller than that preset by a user or a system manager and if no read/write request is issued presently to the SCSI drive 12, the parity is generated and written in the SCSI drive 12.

In another method of writing a parity, it may be written in response to an interrupt process issued at a predetermined time interval. The times of a day, or days in a month, during which the number of read/write requests by CPU becomes small, may be pre-scheduled.

If a failure occurs at one of the SCSI drives of a logical group 10 prior to the completion of generating a parity and writing it in a SCSI drive 12 and the data in the SCSI drive 12 cannot be read, this data can be rebuilt by the old parity and the data in the other SCSI drives if the failed SCSI drive 12 stores data other than the duplicated data, or this data can be rebuilt by using one of the new duplicated data in the SCSI drive if the failed SCSI drive stores the other of the new duplicated data.

BRIEF DESCRIPTION OF THE DRAWINGS

FIG. 10 shows an example of the contents of a logical group table.

DESCRIPTION OF THE PREFERRED EMBODIMENTS

The first embodiment of the present invention will be described with reference to FIGS. 1–5 and FIG. 13.

Figure 1:
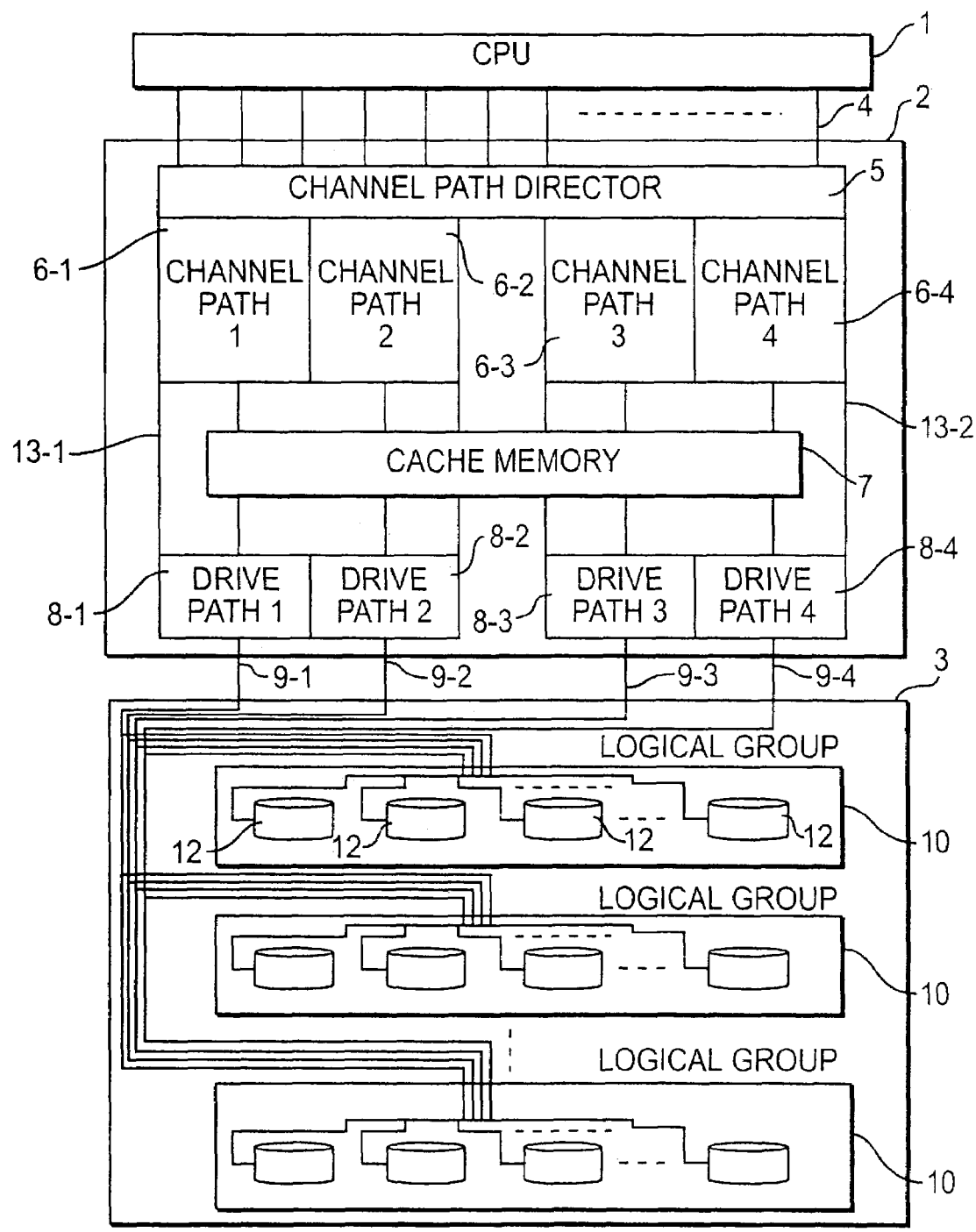
FIG. 1 is a schematic diagram showing the overall structure of a disk array system according to a first embodiment of the present invention.

Referring to FIG. 1, the embodiment system is constituted by a CPU 1, a disk array controller (ADC) 2, and a disk array unit (ADU) 3. ADU 3 includes a plurality of logical groups 10 each having m SCSI drives 12 and drive paths 9-1 to 9-4 interconnecting the SCSI drives 12 and ADC 2. The number of SCSI drives 12 is not limited to a particular number, but any number may be set with the same advantageous effects of the invention. Each logical group 10 constitutes a data rebuilding unit, and a parity is generated from data in the SCSI drives 12 of each logical group 10. In this embodiment, a parity is generated from data in the (m-1) SCSI drives 12.

The internal structure of ADC 2 will be described with reference to FIG. 1. ADC 2 is constituted by a channel path director 5, two clusters 13, and a non-volatile semiconductor cache memory 7 backed up by a battery. The cache memory 7 stores therein data and an address translation table. The cache memory 7 and its address translation table are used in common by the two clusters 13 of ADC 2. Each cluster 13 is a set of paths operable independently in ADC 2, and provided with a separate power source and circuit. Each cluster 13 has two of channel paths 6-1 to 6-4 between channels and the cache memory 7 and two of drive paths 8-1 to 8-4 between the cache memory 7 and SCSI drives 12. The channel paths 6-1 to 6-4 and the drive paths 8-1 to 8-4 are connected together via the cache memory 7. A command issued from CPU 1 is sent via an external interface path 4 to the channel path director 5 of ADC 2. ADC 2 has two clusters 13-1 and 13-2 each having two paths, having four paths in total. It is therefore possible for ADC 2 to receive four commands at the same time from CPU 1. When a command is issued from CPU 1, the channel path director 5 of ADC 2 judges whether the command can be received or not.

Figure 2:
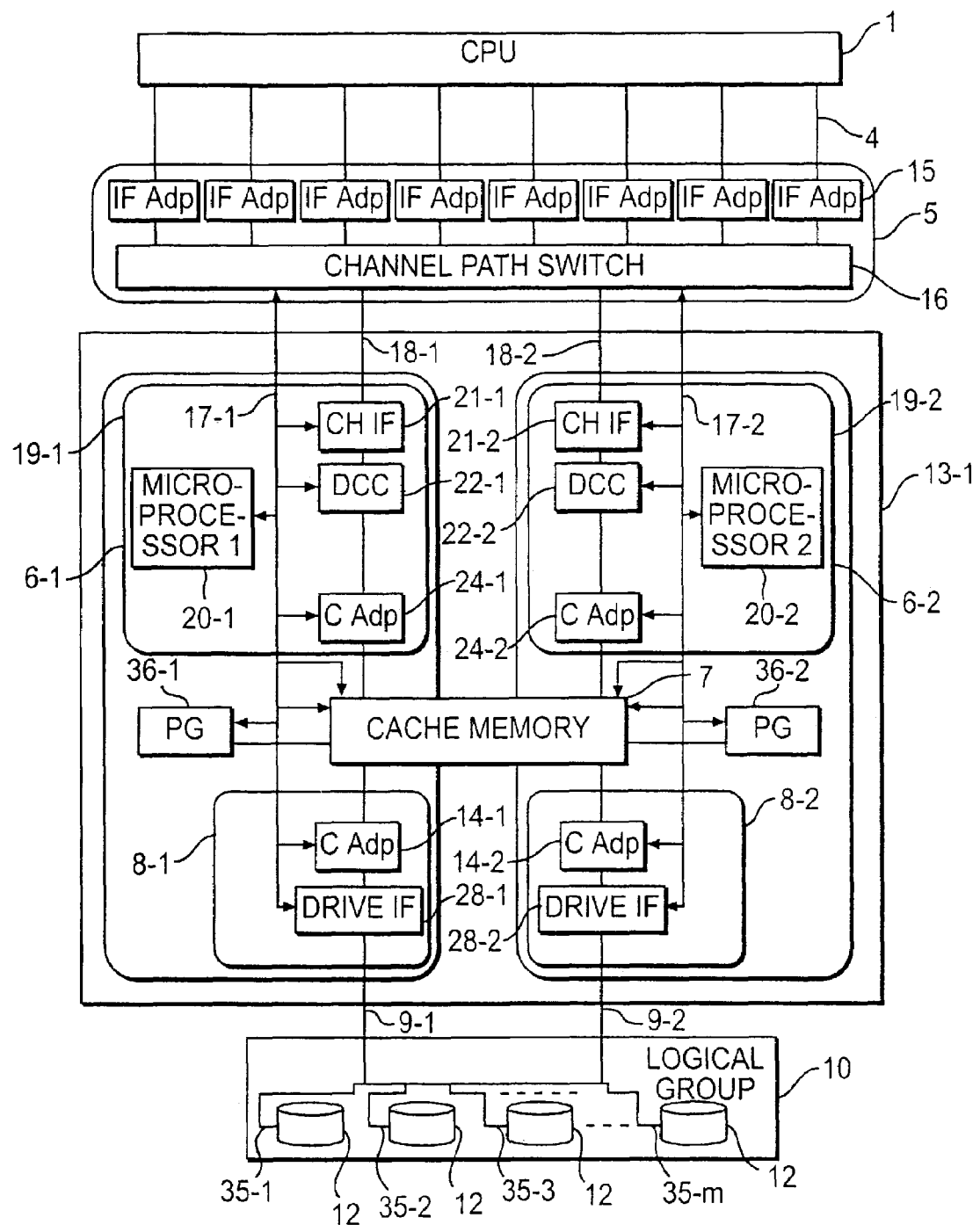
FIG. 2 is a schematic diagram showing the internal structure of the cluster of the first embodiment.

FIG. 2 is a schematic diagram showing the internal structure of the channel path director 5 and one cluster 13-1. As shown in FIG. 2, a command sent from CPU 1 to ADC 2 is received by an interface adapter (IF-Adp) 15. A microprocessor MP1 20 checks whether there is any usable path in the cluster 13. If there is any usable path, MP1 20 causes the channel path director 5 to select a channel path switch 16 to thereby receive the command. If there is no usable path, a reception inhibition response is returned to CPU 1.

In this embodiment, the SCSI drive 12 constituting ADU 3 uses a drive compatible with a SCSI interface. If a mainframe such as an IBM system 9000 is used as CPU 1, CPU 1 issues a command conforming with the command system of a channel interface running on an IBM operating system (OS). It is therefore necessary to convert a command from CPU 1 into a command conforming with such a command system. This command conversion is classified mainly into protocol conversion and address translation. The address translation will be described next.

Figure 12A:
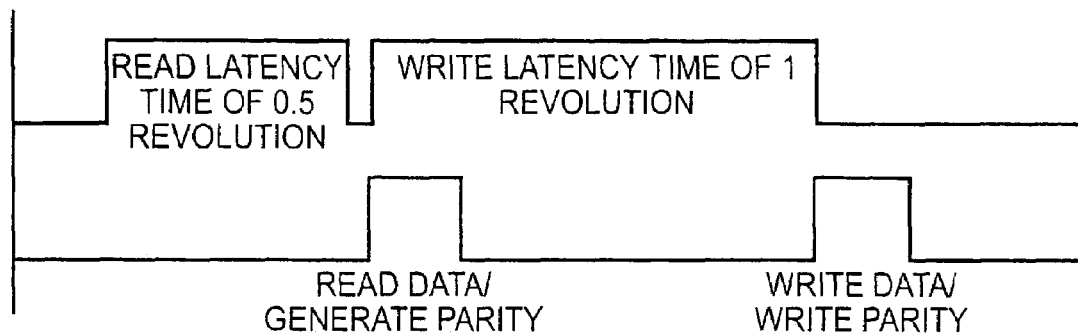
FIGS. 12A and 12B are a timing chart of the write process in RAID-of level 5 and a schematic diagram of a drive.
Figure 12B:
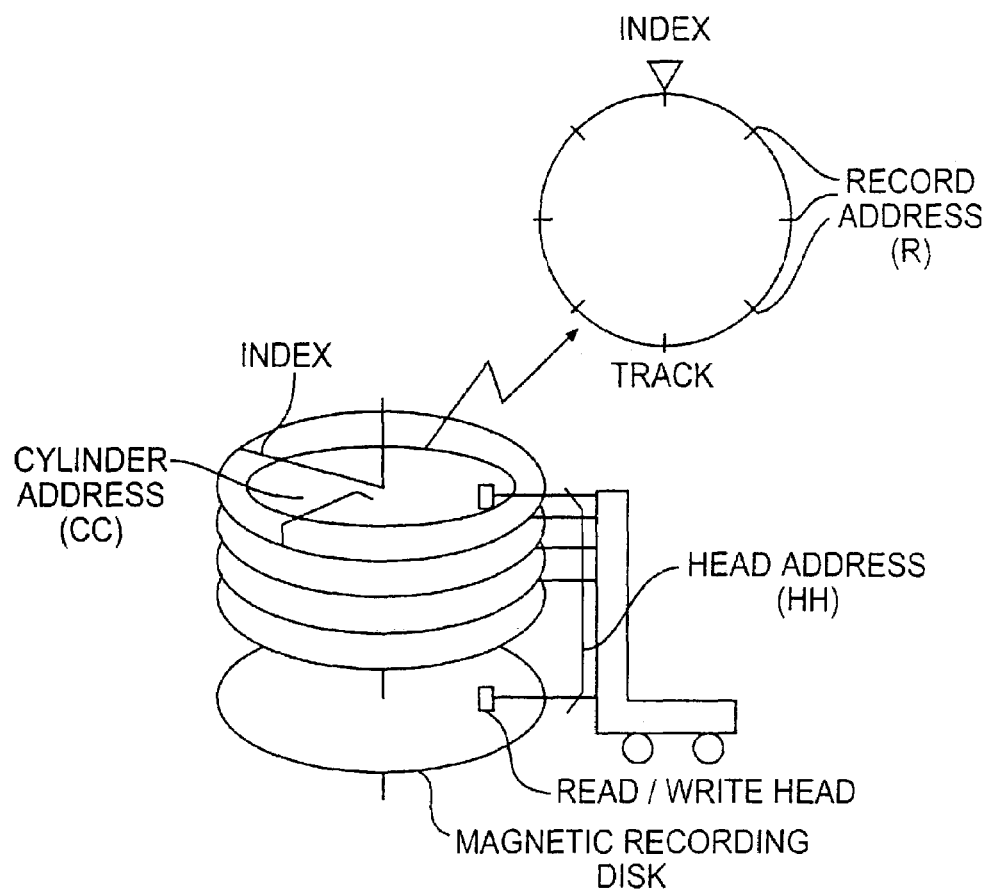

As shown in FIG. 12B, an address supplied from CPU 1 identifies the position of a cylinder to which a data storing track belongs, a head address for determining the data storing track at that cylinder, and the position of a record of the track. Specifically, the address identifies the serial number (drive serial number designated by CPU) of a data storing drive, and CCHHR including a cylinder address (CC) representing the cylinder number of the drive, a head address (HH) representing the serial number of a head selecting a track of the cylinder, and a record address (R).

Figure 3A:
FIGS. 3A and 3B show examples of the contents of an address translation table.

In a magnetic disk sub-system (IBM 3990-3390) of a conventional CKD format, each drive is accessed by using such an address. However, in this embodiment, the magnetic disk sub-system of a conventional CKD format is logically emulated by a plurality of SCSI drives 12. In other words, ADC 2 operates so that CPU 1 can see the plurality of SCSI drives 12 as one drive used by the magnetic disk subsystem of a conventional CKD format. To this end, an address (CPU designated drive number and CCHHR) supplied from CPU 1 is translated by MP1 20 into an address of a SCSI drive. For this address translation, an address translation table 40 (hereinafter simply called an address table) shown in FIG. 3A is used.

Figure 3B:
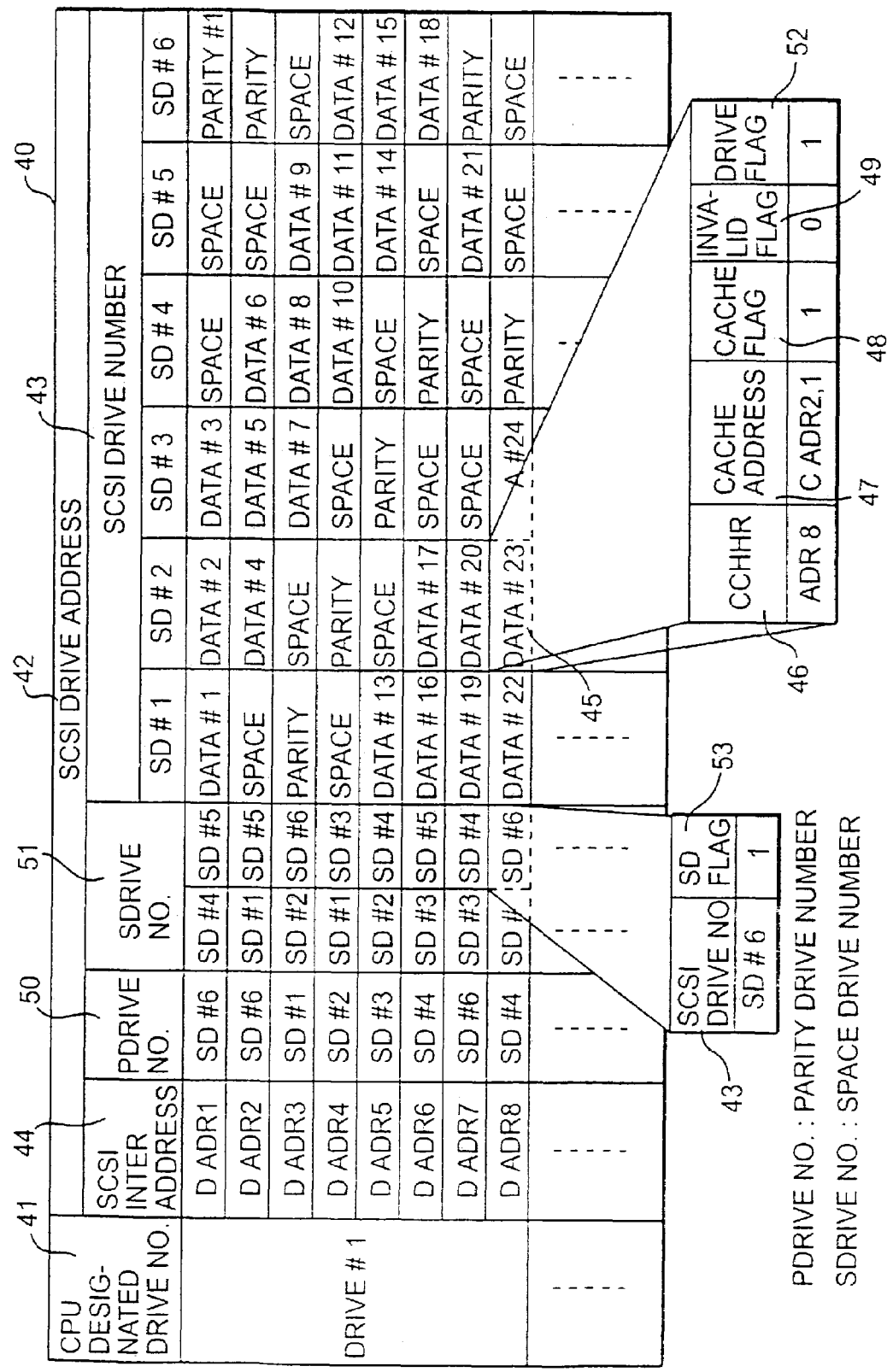

The address table 40 shown in FIG. 3B is stored in the cache memory 7 of ADC 2. In this embodiment, a drive designated by CPU 1 is a single drive corresponding to the CKD format. According to the present invention, since a single drive recognized by CPU 1 is constituted by the plurality of SCSI drives 12, the single drive is required to be recognized as a logical drive. To this end, MP1 20 of ADC 2 translates a CPU designated address (including CPU designated drive number 41 and CCHHR 46) supplied from CPU 1 into a SCSI drive address 42 (including a SCSI drive number 43 and an address 44 of a data location of the SCSI drive (hereinafter abbreviated as SCSI Inter-Addr).

The address table 40 stores combinations of CPU designated drive numbers 41 and SCSI drive addresses 42. A SCSI drive address 42 includes a SCSI drive number 43 of SCSI drives 12, a SCSI Inter-Addr 44 representing the address of a data location in the SCSI drive, a SCSI drive number (parity drive number) 50 of a SCSI drive in which a parity of a parity group in the logical group 10 determined by the SCSI Inter-Addr 44 is stored, and SCSI drive numbers (space drive numbers 51) of SCSI drives to which duplicated fields (space fields) are allocated. By using a logical address 45 stored in the address table 40, the SCSI drive number 43 and SCSI Inter-Addr 44 are determined. Each logical group 10 is constituted by SCSI drives 12 having SCSI drive numbers 43 registered in the SCSI drive address 42 of the address table 40.

The SCSI drive number 43 of a SCSI drive storing a parity for the same SCSI Inter-Addr 44 in each logical group 10 is registered as the parity drive number 50, and the SCSI drive numbers 43 allocated with space fields is registered as the space drive numbers 51. The field of each space drive number 51 stores an SD flag 53 as well as the space drive number 51. The SD flag 53 turns on (takes "1") if the space field stores valid data and cannot be used for data write, and turns off (takes "0") if the space field stores invalid data and can be used. Each logical group 10 is constituted by a parity group including data and its parity, and space fields.

Each logical address 45 field stores a CPU designated drive number 41 and a CCHHR 46. It also stores a cache address 47 indicating a data location in the cache memory 7 if the same data at the logical address 45 is stored in the cache memory 7, a cache flag 48 which turns on (taking "1") when the same data at the logical address 45 is stored in the cache memory 7, an invalid flag 49 which turns on (taking "1") if space fields have been allocated at the logical address 45, and a drive flag 52 which turns on (taking "1") if data in the cache memory 7 has been written in the SCSI drive.

In the above manner, by using the address table 40, a CPU designated drive number 41 and CCHHR 46 are converted into a logical address 45 to thereafter determine a SCSI drive number 43 and SCSI Inter-Addr 44 where data is actually stored.

At the initial setting of the address table, SCSI drives 12 constituting each logical group 12 and SCSI Inter-Addr 44 are registered. Next, logical groups 10 are allocated to each CPU designated drive number 41. After these settings are completed, data can be written. A method of registering information in the address table when data is written in a SCSI drive will be described. When a write request of Data#1 is issued, Data#1 is written in the SCSI drive 12 of SD#1 at SCSI Inter-Addr 44 of DADR1 because no data has been written in SCSI drives of SD#1 to SD#6. Parity#1 is calculated assuming that other data are all 0, and written in the SCSI drive of SD#6 at DADR 1. SD#6 is registered as the parity drive number. When a write request of D#2 is issued, D#2 is written in the SCSI drive 12 of SD#2 at DADR 1, and a parity P#1 is updated. In this manner, data is written. At the initial settings, the SCSI drives of SD#4 and SD#5 are all registered as the space fields in the space drive number 51, and the SCSI drives of SD#6 are all registered as the parity fields in the parity drive number 50.

Referring to FIGS. 3A and 3B, when CPU 1 issues a data read/write request by designating Drive#1 as the CPU designated drive number 41 and designating the data at ADR 8 as CCHHR 46, logical address 45 fields of the address table 40 at the CPU designated drive number 41 of Drive#1 are checked to search a logical address 45 whose CCHHR 46 is ADR 8. In the example shown in FIG. 3B, the logical address 45 whose CCHHR 46 is ADR 8 corresponds to Data#23 (D#23).

From the address table 40, it can be found that Date#23 (D#23) corresponds to DADR 8 of the SCSI Inter-Addr 44 of the SCSI drive 12 having the SCSI drive number SD#2. In this manner, the logical address is converted into a physical address. From the parity drive number 50, it can be found that a parity for Data#23 (D#23) is stored in the SCSI drive 12 of SD#4 at the same SCSI Inter-Addr 44 as that for Data#23 (D#23). From the spare drive number 51, it can be found that data stored duplicately in SCSI drives of SD#4 and SD#5 at the SCSI Inter-Addr 44 of DADR 8 are valid and these fields are inhibited to be used as the duplicated fields (space fields).

In the above manner, the CPU designated address is converted into a logical address 45 which is in turn converted into a physical address of a SCSI drive 12 to and from which data is actually transferred. Thereafter, a read/write request for Data#23 (D#23) in the SCSI drive 12 of SD#2 is issued. In the above example of the address table 40, the cache flag 48 is on ("1") at the logical address 45 corresponding to Data#23 (D#23). This means that the data is present in the cache memory 7 at CADR 2, 1. If the cache flag 48 is off ("0"), the data is not present in the cache memory 7 at CADR 2, 1. Also in the above example of the address table 40, the invalid flag 49 is off ("0") so that the data is valid, and the drive flag 52 is on ("1") so that the data has been written from the cache memory 7 to the SCSI drive 12.

The address table 40 is automatically read from a particular SCSI drive 12 of a logical group 10 into the cache memory 7 under the control of not CPU 1 but MP1 20, when the system power is turned on. On the other hand, when the system power is to be turned off, MP1 20 automatically stores the address table 40 of the cache memory 20 into the particular SCSI drive 12 at a predetermined area without the help of CPU 1.

An I/O process at ADC 2 will be described with reference to FIGS. 1 and 2. A command issued by CPU 1 is received via an IF-Adp 15 by ADC 2, and MP1 20 analyzes the command whether it is a read request or a write request. First, the I/O process for the read request will be described.

If MP1 20 judges a command as a read request, MP1 20 converts a CPU designated drive number 41 and CCHHR 46 (hereinafter collectively called a CPU designated address) into a logical address 45 for the data to be read by referring to the address table 40, and checks the cache flag 48 at the logical address whether or not the data is present in the cache memory 7.

If the cache flag 48 is on and the data is present in the cache memory 7 (in the case of cache hit), MP1 20 starts the control operation of reading the data from the cache memory 7, whereas if the data is not present in cache memory 7 (in the case of cache miss), MP1 20 starts the control of reading the data from the SCSI drive 12.

In the case of a cache hit, MP1 20 converts the CPU designated address supplied from CPU 1 into a logical address 45 by referring to the address table 40, and in accordance with the logical address 45, the cache address of the cache memory 7 is obtained to read the data from the cache memory 7. Specifically, under control of MP1 20, a cache adapter (C-Adp) 24 reads the data from the cache memory 7.

C-Adp 24 is a circuit for reading/writing data from and to the cache memory 7 under control of MP1 20, by monitoring the state of the cache memory 7 and executing an exclusive control of a read/write request. The data read by C-Adp 24 is transferred to a channel interface (CH-IF) 21 under control of a data control circuit (DCC) 22. CH-IF 21 changes a protocol into a protocol matching a channel interface between CPU 1 and ADC 2 to thereby adjust a data transfer speed so as to match the channel interface. Specifically, if an optical interface is used as a channel interface between CPU 1 and ADC 2, an optical interface protocol is converted into an electrical interface protocol in ADC 2. After the protocol change and transfer speed change by CH-IF 21, a channel path switch 5 of the channel path director 5 selects an external interface path 4 to transfer data from IF-Adp 15 to CPU 1.

In the case of a cache miss, a CPU designated address is converted into a logical address 45 by referring to the address table 40 similar to the case of a cache hit, and in accordance with the logical address 45, the SCSI drive number and SCSI Inter-Addr 44 indicating the data location in the SCSI drive are obtained. MP1 20 instructs Drive-IF 28 to issue a read request to the SCSI drive 12 at the SCSI Inter-Addr 44. In accordance with a SCSI read procedure, Drive-IF 28 issues a read command to the SCSI drive 12 via a drive unit path 9-1 or 9-2. Upon reception of the read command from Drive-IF 28, an access process including a seek and latency is performed for the SCSI drive 12. After the completion of the access process, the data is read from the SCSI drive 12 and transferred to Drive-IF 28 via the drive unit path 9.

The data transferred to Drive-IF 28 is sent to a cache adapter (C-Adp) 14 on the SCSI drive side which stores it in the cache memory 7. In this case, C-Adp 14 reports MP1 20 that the data has been stored in the cache memory 7. In response to this report, MP1 20 turns on ("1") the cache flag 48 in the address table 40 at the logical address 45 corresponding to the CPU designated data read address issued by CPU 1, and stores the cache address 47 of the data location in the cache memory 7. After the data has been stored in the cache memory 7, after the cache flag 48 in the address table 40 has been turned on ("1"), and after the cache address 47 of the data location in the cache memory 7 has been updated, the data is transferred to CPU 1 in the manner like the case of a cache hit.

Next, the I/O process for the write request will be described.

Figure 11:
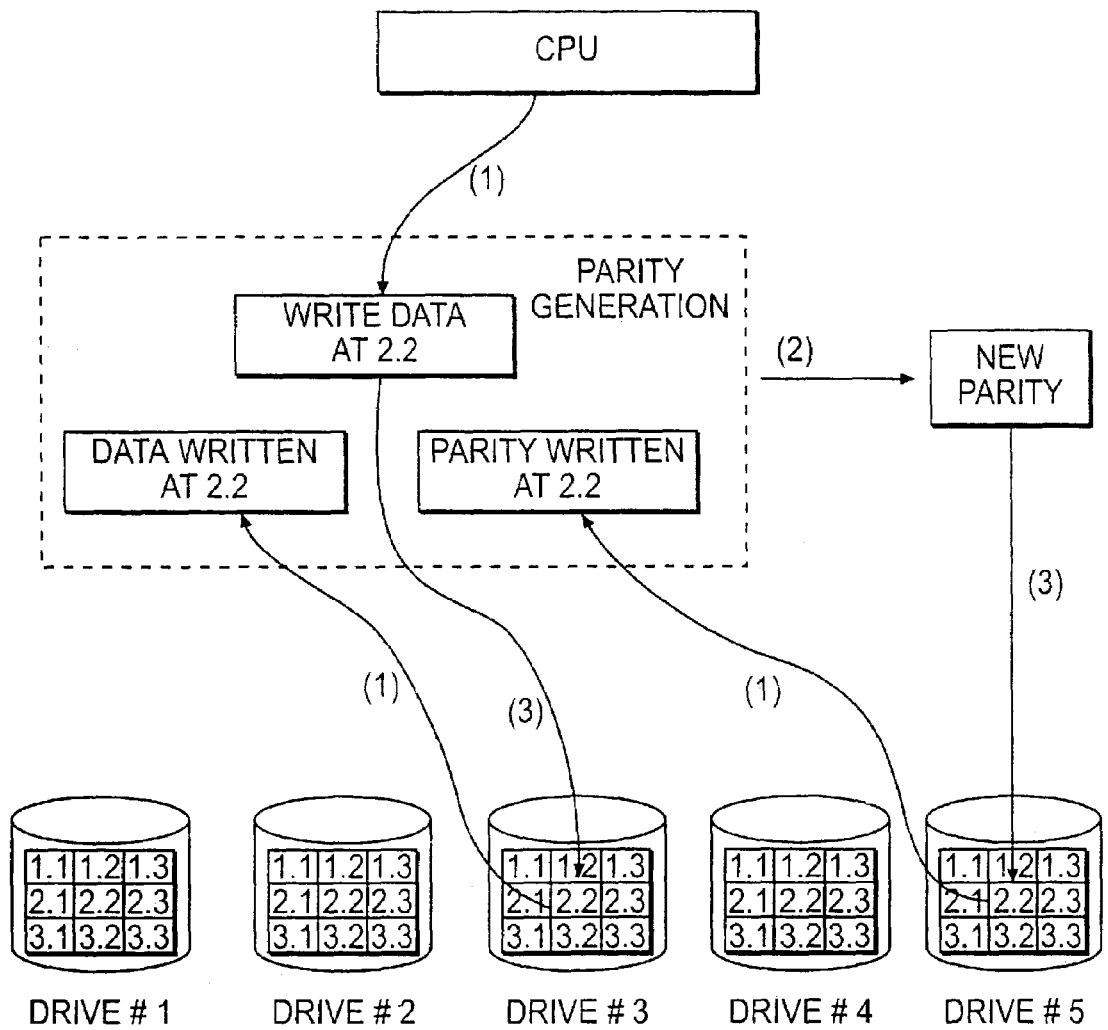
FIG. 11 is a schematic diagram explaining the update process in RAID of level 5.

The characteristic feature of this embodiment is as follows. When data is to be updated, this data is duplicately written in two SCSI drives 12 at the space fields, the two SCSI drives not being the SCSI drive in which the old data has been stored. At this time, a completion of data update is tentatively informed to CPU 1 so as to allow the update of the parity of the level 5 to be delayed while maintaining an operation reliability. In this manner, the update of the parity of the level 5 such as shown in FIG. 11 can be delayed until the number of read/write requests from CPU 1 reduces, while maintaining an operation reliability. In the conventional operation of the level 5, a parity is updated each time a write request is processed even if an increased number of write requests are issued. The parity update of the level 5 shown in FIG. 5 has a large overhead, resulting in a bottleneck of the operation.

In the data write procedure, a user designates a data write address (CPU designated address) and conceives data to be written at this address. That is, the user conceives the address to represent a fixed location.

It is assumed that CPU 1 issues a data write command relative to a designated address, e.g., ADR 8 of CCHHR 46 of Drive#1 of the CPU designated drive number 41 in the address table 40. After receiving the write request command relative to ADR 8 of CCHHR 46 of Drive#1 from CPU 1, MP1 20 of ADC 2 checks whether the data write can be processed at a channel path 6 of the corresponding cluster 13. If possible, a response indicating that the data write can be processed is returned back to CPU 1. Upon reception of this response, CPU 1 transfers write data to ADC 2. Under control of MP1 20 of ADC 2, the external interface path 4 and IF-Adp 15 are connected to the channel path 6 via a channel switch 16 of the channel path director 5 to thereby establish a connection between CPU 1 and ADC 2.

After the establishment of the connection between CPU 1 and ADC-2, data transfer from CPU 1 is permitted. CH-IF 21 changes a protocol into a protocol matching a channel interface for ADC 2, and adjusts the data transfer speed at the external interface path 4 so as to match a data transfer speed at ADC 2. After the protocol change and speed change by CH-IF 21, the write data (hereinafter called new data) sent from CPU 1 is transferred to C-Adp 24 and stored in the cache memory 7 under the data transfer control by DCC 22.

The CPU designated address is sent from CPU 1 always prior to sending data, and is translated into a logical address by referring to the address table 40 similar to the case of data read. The new data sent from CPU 1 is stored in the cache memory 7. In this case, the address of the new data in the cache memory 7 is registered in the cache address 47 field at the logical address 45 identified by the address translation. If the new data is to be maintained in the cache memory 7, the cache flag 48 at the logical address 45 is turned on ("1"), whereas if not to be maintained, it is turned off ("0").

If another write request is issued from CPU 1 relative to the new data maintained in the cache memory 7, the new data in the cache memory 7 is overwritten.

The parity is updated by the new data stored in the cache memory 7 (updated parity is called a new parity). The new data and new parity are stored in a SCSI drive 12 of the logical group 10 in the following manner.

As shown in FIG. 3A, space fields and parities are dealt with in the same manner as data, and distributedly stored in SCSI drives 12 constituting the logical group. A parity group is constituted by data in the SCSI drives 12 of each logical group 10 in the row direction (same SCSI Inter-Addr 44) and a parity. A parity is calculated from data in each parity group. In other words, the parity group is constituted by data and a parity, and the logical group is constituted by a parity group and space fields.

A specific example of data, parities, and space fields is shown in FIG. 3A. For the SCSI Inter-Addr 44 of DADR 1, a parity is calculated from data #1 (D#1) in the SCSI drive 12 of SD#1, Data#2 (D#2) in the SCSI drive 12 of SD#2, and Data#3 (D#3) in the SCSI drive of SD#3. This parity is stored in the SCSI drive 12 of SD#6. These data and parity constitute a parity group. The logical group 10 is constituted by the parity group and a space field (S) at the SCSI drive 12 of SD#4 and a space field (S) at the SCSI drive of SD#5.

MP1 20 recognizes the SCSI drives which store data, space fields, and a parity, by referring to the address table 40. Specifically, MP1 20 checks the address table 40 at the region corresponding to the CPU designated drive number 41 and searches the logical address 45 registered in the SCSI drive address 42 and having the same CCHHR 46 designated by the CPU designated address. After the CPU designated address is translated into the logical address 45, MP1 20 translates the logical address 45 into the SCSI drive number 43 of the drive storing the logical address 45 and into the physical SCSI Inter-Addr 44 of the data location in the SCSI drive 12.

A parity is calculated from data in the SCSI drives of a logical group 10 at the same SCSI Inter-Addr 44, and stored in the drive at the same SCSI Inter-addr 44. In the fields of the parity drive number 50 and space drive number 51 of the address table 40, only SCSI drive numbers 43 are stored. As a result, MP1 20 can determine from the address table 40 the parity drive number 50 and space drive numbers 51. That is to say, by determining the parity drive number 50 and space drive numbers 51, the addresses of the SCSI drives storing the parity and space fields at the same SCSI Inter-Addr 444 can be identified. After the SCSI drives 12 storing data, space fields, and a parity are recognized, MP1 20 instructs Drive-IF 28 to perform a write operation relative to the corresponding SCSI drives.

Figure 5:
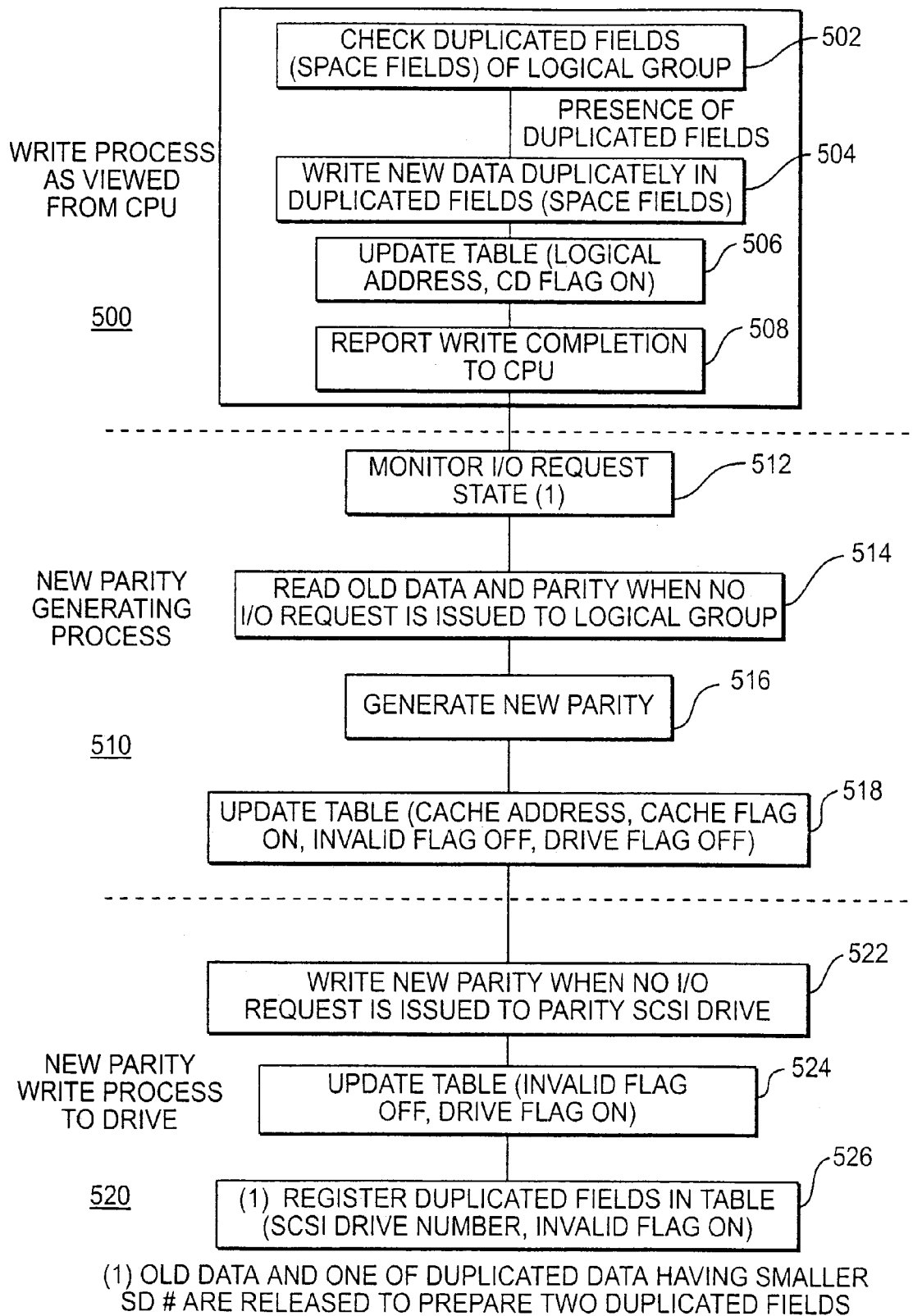
FIG. 5 is a flow chart explaining the operation of a first write process.

The write process in this invention includes a series of processes of writing the new data stored in the cache memory 7 into a SCSI drive 12 of each logical group 10, calculating the new parity by reading the data before the data write (hereinafter called old data) and reading the parity before the data write (hereinafter called old parity), and writing the new parity in the SCSI drive 12. FIG. 5 is a flow chart showing the series of processes after the new data is stored in the cache memory 7.

Figure 4A:
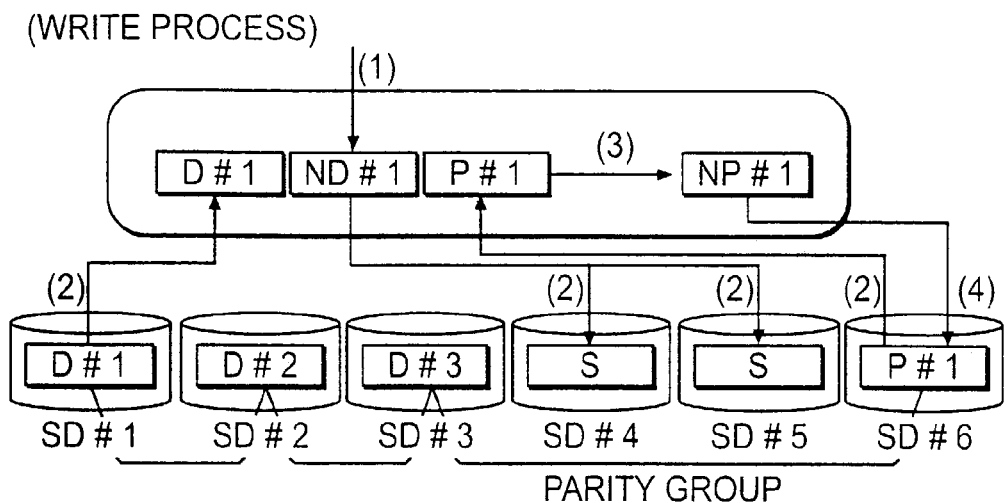
FIGS. 4A, 4B, and 4C are schematic diagrams showing the data flow in the write process.

As shown in FIG. 4A, when CPU 1 issues a write request of new data ND#1 into the SCSI drive 12 of SD#1 at the logical address of Data#1 (D#1), this new data is temporarily stored in the cache memory 7 as described previously. After the new data is stored in the cache memory 7, the write operation is executed in the following manner. After the new data (ND#1) has been stored in the cache memory 7, MP1 20 acquires a use right of the SCSI drives 12 of SD#4 and SD#5 having the space fields at the SCSI Inter-Addr 44 of DADR 1 of the logical group 10 to which the SCSI drive 12 of SD#1 for Data#1 (D#1) belongs.

After the use right of the SCSI drives 12 of SD#4 and SD#5 has been acquired, a write process 500 shown in the flow chart of FIG. 5 is executed. First, MP1 20 checks the SD flags 53 in the space drive number 51 of the address table 40. If the SD flags 53 are off ("0"), it is judged that the space fields can be used, whereas the SD flags are on ("1"), it is judged that they cannot be used (Step 502). From these SD flags 53, MP1 20 judges whether the SCSI drives 12 of SD#4 and SD#5 have available space fields. If the SD flags 53 are off ("0"), ND#1 stored in the cache memory 7 is duplicately written in the SCSI drives 12 of SD#4 and SD#5 (Step 504), the logical address of ND#1 is registered in the fields of SD#4 and SD#5 of the address table 40, and the SD flags 53 are turned on ("1") at SD#4 and SD#5 of the space drive number 51. Thereafter, MP1 20 reports a write completion to CPU 1 (Step 508).

Figure 13:
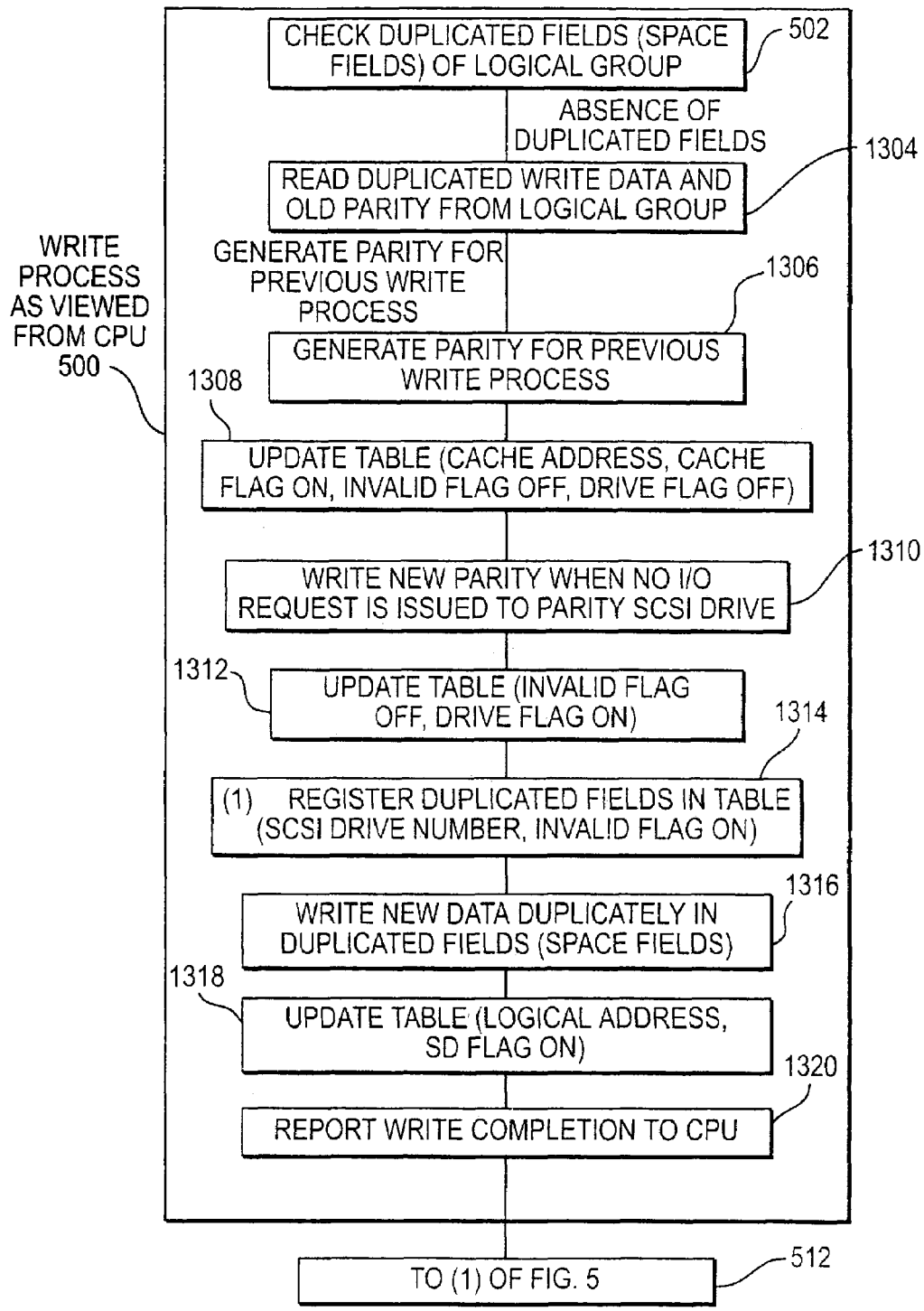
FIG. 13 is a flow chart explaining the operation of a second write process.

If the SD flags are on ("1") at Step 502, as shown in the flow chart of FIG. 13, after the new data (ND#1) has been written in the cache memory 7, MP1 20 instructs preferentially to generate a parity at the preceding write process, and this parity is written in the SCSI drive 12 (Step 1310). After the parity at the preceding write process has been generated and written in the SCSI drive 12, MP1 20 turns off ("0") the SD flags 53 in the space drive number 51 of the address table 40 (Step 1308), duplicately writes the new data (ND#1) stored in the cache memory 7 (Step 1316), and reports a write completion to CPU 1 (Step 1320).

Next, a method of writing the new data (ND#1) into SCSI drives 12 will be described.

After confirming that the SD flags 53 in the address table 40 are off ("0"), MP1 20 instructs Drive-IF 28 to write the new data (ND#1) into the SCSI drives 12 of SD#4 and SD#5 having the available space fields. In accordance with a SCSI write procedure, Drive-IF 28 issues a write command to the SCSI drives 12 of SD#4 and SD#5 via two paths of the drive unit paths 9-1 to 9-4.

The SCSI drives 12 received the write command from Drive-IF 28 translate the CPU designated address sent from Drive-IF 28 into the logical address of Data#1, and perform an access process including a seek and latency for DADR 1 at the SCSI Inter-Addr 44 corresponding to the logical address. When the SCSI drives 12 of SD#4 and SD#5 complete the access process and when it becomes possible to write data, C-Adp 14 reads the new data (ND#1) form the cache memory 7, and transfers it to the Drive-IF 28 which in turn transfers the new data (ND#1) to the SCSI drives 12 of SD#4 and SD#5 via the two paths of the drive unit paths 9-1 to 9-4. After the new data (ND#1) has been written in the SCSI drives 12 of SD#4 and SD#5, the SCSI drives 12 report a write completion to Drive-IF 28. Drive-IF 28 reports MP1 20 to the effect that the write completion has been received.

At this time, the invalid flags of the logical addresses 45 of old Data#1 (D#1) before the write process are turned on ("1"). The addresses in CCHHR 46 of the logical addresses 45 of old Data#1 (D#1) are registered in CCHHR 46 of the two logical addresses of the space fields in which the new data (ND#1) has been duplicately written. Thereafter, the invalid flags are turned off ("0") and the drive flags 52 are turned on ("1"). If the new data (ND#1) is held in the cache memory 7, the address of the new data (ND#1) in the cache memory 7 is registered as each cache address 47 of the two logical addresses 45 after the write process, and each cache flag 48 is turned on ("1"). If the new data (ND#1) is not to be held in the cache memory 7, MP1 20 responds to this instruction and turns off ("0") each cache flag 48 of the address table and turns on ("1") each SD flag of the space drive number 51 of the data written logical group 10 at the SCSI Inter-Addr 44.

If CPU 1 issues a read request for the duplicate update data before the parity is updated in the manner described later, the following process is executed at the time of address translation in the above-described read process. First, MP1 20 checks the cache flags in the address table 40 for the data which CPU 1 wants to read, whether the data is present in the cache memory 7 or not. Although two flags for the data are registered in the address table 40 because the data has been duplicately stored, MP1 20 checks the flag for the data having a smaller SCSI drive number 43. If the cache flag for the data in the address table 40 checked by MP1 20 is on ("1"), the data is read from the cache memory 7 by the cache hit read process of the above-described read process. On the other hand, if the cache flag is off ("0"), one of the duplicate data is read from the SCSI drive 12 having a smaller SCSI drive number 43 by the cache miss read process of the above-described read process. The data not duplicately written is read by the above-described read operation.

When the address table 40 has been updated in the manner described above and MP1 20 has received the completion reports from the SCSI drives 12 of SD#4 and SD#5, MP1 20 reports a tentative write completion to CPU 1. Even after the new data (ND#1) has been stored in the SCSI drives 12 of SD#4 and SD#5, the new data (ND #1) is still in the cache memory 7 so that updating the parity is performed by using the new data (ND#1) in the cache memory 7.

After MP1 20 has reported the tentative write completion to CPU 1, CPU 1 recognizes the write completion. However, on the side of MP1 20, the write process is not still completed because MP1 20 is required to generate the new parity and store it in the SCSI drive 12. As a result, after MP1 20 has reported the tentative write completion to CPU 1, MP1 20 generates the new parity and writes it in the SCSI drive. This method will be described next.

After MP1 20 has reported the tentative write completion to CPU 1, MP1 20 monitors the read/write requests (I/O state) of CPU 1 as shown in the flow chart of FIG. 5 (Step 510). MP1 20 counts the number of read/write requests per unit time issued by CPU 1 relative to the subject logical group 10. If this number is smaller than the number preset by a user or a system manager and if CPU 1 does not presently issue a read/write request relative to the logical group to which the SCSi drives 12 for the parity generation and writing belong, the operation starts for generating the parity and writing it in the SCSI drive 12.

The old data and old parity at the write address designated by CPU 1 are read to generate the new parity and store it in the SCSI drive 12. In this case, MP1 20 issues a tentative read/write request, like a read/write request from CPU 1, to the SCSI drives from which the old data and parity are read and to the SCSI drive to which the new parity is written. If CPU 1 issues a read/write request to the SCSI drives 12 to which the tentative read/write request has been issued, MP1 20 receives the read/write request of CPU 1 and holds it as a process wait queue.

Next, the method of generating a new parity and writing it in a subject SCSI drive 12 will be detailed.

MP1 20 instructs Drive-IF 28 to issue a read request of the old data from the SCSI drive of SD#1 and a read request of the old parity from the SCSI drive 12 of SD#6 (Step 514). The SCSI drives 12 received the read command from Drive-IF 28 perform an access process including a seek and latency to the SCSI Inter-Addr 44 sent from Drive-IF 28. Updating the parity is performed by using the new data (ND#1) stored in the cache memory 7.

If the new data (ND#1) is not present in the cache memory 7, the data duplicately written in the space fields is read and written in the cache memory 7.

When the SCSI drives 12 of SD#1 and SD#6 have completed the access process including a seek and latency and when it becomes possible to read the old data (D#1) and old parity (P#1), the old data (D#1) and old parity (P#1) are read and stored in the cache memory 7. Thereafter, MP1 20 instructs PG 36 to generate the new parity (NP#1) by an exclusive logical sum of the old data (D#1) and the new data (ND#1) in the cache memory 7. The new parity (NP#1) generated by PG 36 is stored in the cache memory (Step 516).

After the new parity (NP#1) has been stored in the cache memory 7, MP1 20 registers the address of the new parity (NP#1) in the cache memory 7 as the cache address 47 of the logical address 45 at which the new parity (NP#1) is to be stored, turns on ("1") the cache flag 48, and turns off ("0") the invalid flag 49 and drive flag 52 (Step 518). After MP1 20 recognizes the completion of generating the new parity (NP#1) and when an I/O request is not presently issued to the SCSI drive 12 of SD #6, it instructs Drive-IF 28 to write the updated new parity (NP#1).

The method of writing the updated new parity (NP#1) in the SCSI drive 12 of SD#6 is the same as the method of writing the new data (ND#1) into the SCSI drives of SD#4 and SD#6. After the new parity (NP#1) has been generated, MP1 20 instructs Drive-IF 28 to issue a write command to the SCSI drive 12 of SD#6 so that the SCSI drive 12 performs an access process including a seek and latency of the SCSI Inter-Addr 44. If the new parity (NP#4) has been already generated and stored in the cache memory 7 and the access process by the SCSI drive 12 of SD #6 has been completed, C-Adp 14 reads the new parity (NP#1) from the cache memory 7 and transfers it to Drive-IF 28 which in turn transfers it via one path of the drive unit paths 9-1 to 9-4 to the SCSI drive 12 of SD#6 (Step 522).

When writing the new parity (NP#1) into the SCSI drive 12 of SD#6 is completed, the SCSI drive 12 of SD#6 reports a write completion to Drive-IF 28 which in turn reports the reception of this write completion to MP1 20. In response to this report, MP1 20 turns off ("0") the cache flag 48 if the new data (ND#1) is not to be held in the cache memory 7, and turns on ("1") if it is to be held in the cache memory 7. The invalid flag of the address table 40 at the logical address of the written new parity (NP#1) is turned off ("0"), and the drive flag 52 is turned on ("1") (Step 524).

After the new parity (NP#1) has been written in the SCSI drive, the old data (D#1) in the SCSI drive 12 of SD #1 and one of the duplicate new data (ND#1) in the SCSI drive having a smaller SCSI drive number of SD#4 than SD#6 are released to form space fields which are registered as the space fields for the next write process. To register these space fields, MP1 20 turns on ("1") the invalid flags of the address table 40 at the logical addresses at which stored are the old data (D#1) in the SCSI drive of SD#1 at the SCSI Inter-Addr 44 of DADR 1 and one of the duplicate new data (ND#1) in the SCSI drive having a smaller SCSI drive number of SD #4, registers SD#4 and SD#6 as the space drive numbers 51, and turns off ("0") the SD flags (Step 526).

As described above, the new data (ND#1) is duplicated and temporarily stored in the logical group. Thereafter, the new parity (NP#1) is generated when the number of read/write requests by CPU 1 becomes relatively small, and stored in the SCSI drive. Accordingly, a response time during the write process can be reduced, and the number of read/write operation standbys to be caused by the generation of the new parity (NP#1) becomes small as compared to the conventional method.

The characteristic feature of this embodiment is that after the parity of the level 5 has been updated, the old data and one of the duplicate new data written in the space fields are released to form new space fields for the next write operation.

JP-A-6-19632 filed by IBM Corp. discloses a method of delaying a parity update process in which a drive called WAD is provided, and in the write process, data is written both in a cache memory and WAD. WAD is a non-volatile drive for backing up data in a volatile cache memory. If a power failure or the like does not occur, the normal parity update process of the level 5 is performed by using the data in the cache memory, and the new data is overwritten on the data to be updated. If a power failure occurs, the new data in the cache memory has been erased so that the new data in WAD is read. Accordingly, in the write operation, two write operations are required, including writing the new data in WAD and overwriting the new data on the old data after the parity is updated. For these two write operations, an overhead of two seeks and latencies are required.

According to the embodiment, new data is duplicately written in the write process so that after the parity update, it is necessary only to release space fields and register them in the address table. Although it requires two write operations in duplicately wiring the new data, as in the case of using WAD, these write operations are processed in parallel so that the overhead of seeks and latencies corresponds to generally one write operation.

Furthermore, according to the embodiment, the addresses of data and space fields change dynamically so that it is possible to uniformly distribute read/write requests by CPU 1 into respective SCSI drives in a logical unit 10.

Still further, according to the embodiment, the addresses of data, space fields, and a parity change dynamically at the same SCSI Inter-Addr 44, facilitating the address management. Obviously the same advantages of the embodiment are attained even if addresses are dynamically changed at different SCSI Inter-Addr 44.

Next, a method of dealing with a failure of an arbitrary SCSI drive in a logical group 10 will be described.

Figure 14:
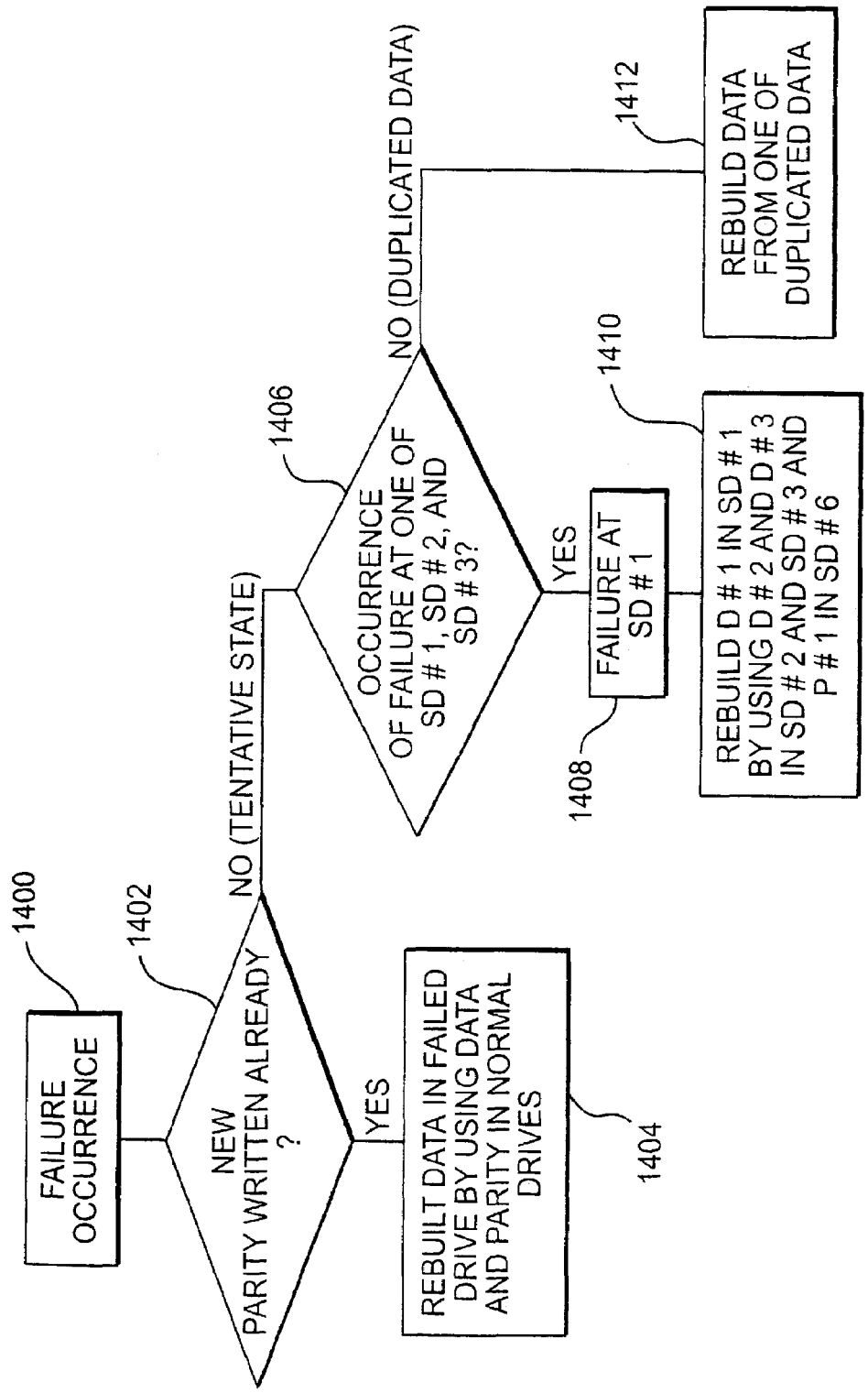
FIG. 14 is a flow chart explaining the operation of a data rebuilding process.

If a failure occurs in one of SCSI drives of a disk array and data in the SCSI drive cannot be read, this data can be rebuilt from the other data and a parity. The characteristic feature of this embodiment is that new data is duplicately written in two space field of two SCSI drives to allow the parity update to be delayed while ensuring the reliability. If a failure occurs in a SCSI drive 12 in a logical group 10 prior to writing a new parity (NP#1) to a SCSI drive 12, the rebuilding process is performed in the manner shown in the flow chart of FIG. 14. In the rebuilding process, a failed SCSI drive 12 is replaced by a normal SCSI drive 12, and data in the failed SCSI drive 12 is rebuilt and stored in the normal SCSI drive 12. If a reserved SCSI drive is prepared, the SCSI drives are not replaced but they are only switched.

In this embodiment, data in a failed SCSI drive can be rebuilt either by using the data and parity stored in the other SCSI drives in the same logical group 10 or by copying one of the duplicated data. The rebuilding process will be described more in detail below.

Figure 4B:
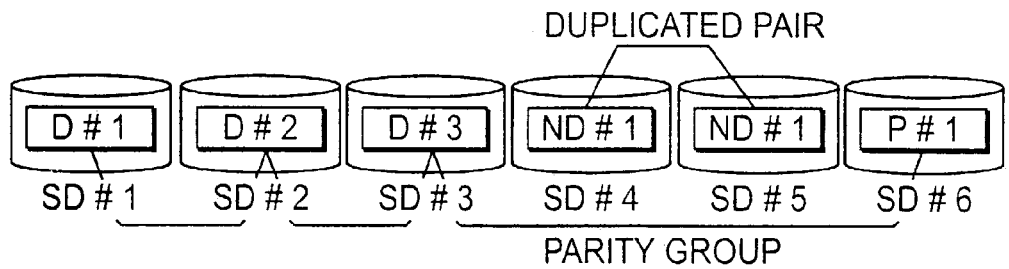

As shown in FIG. 4B, if a failure occurs in one of SCSI drives of SD#1, SD#2, and SD#3 (Step 1406) prior to writing a new parity (NP#1) in the SCSI drive 12 of SD#6 (Step 1402), it is possible to rebuild the data in the failed SCSI drive by using the data and old parity in the other SCSI drives (Step 1410). For example, if a failure occurs in the SCSI drive 12 of SD#1, D#2 and D#3 in SD#2 and SD#3 and the old parity (D#1) are transferred to PG 36 which calculates an exclusive logical sum of the data and parity to rebuild D#1 in the failed SCSI drive 12 of SD#1. If a failure occurs in one of the SCSI drives of SD#4 and SD#5 storing the duplicate new data (ND#1), one of the duplicate new data is copied to rebuild the new data (Step 1412).

If CPU 1 issues a read/write request to the data in the failed SCSI drive 12 to which the data rebuilding process is not still performed, the following process is carried out.

In the case of a read request by CPU 1, similar to the rebuilding process, the read requested data is rebuilt and read. If the data can be rebuilt by using the parity, data and a parity necessary for rebuilding the data are read from the normal SCSI drive 12 of the logical group 10, and PG 36 calculates an exclusive logical sum thereof to rebuild the data, and transfers it to CPU 1. If the data is one of the duplicate data, the other of the duplicate data is read and transferred to CPU 1.

In the case of a write request by CPU 1 and if the failed SCSI drive is allocated with a space field in which one of the duplicate data has been written, a general parity update of the level 5 is performed, and the new data is overwritten on the old data and the new parity is overwritten on the old parity. If the failed SCSI drive is not allocated with a space field, the new data is written in the manner like the normal operation even if the old data is in the failed SCSI drive 12.

Figure 4C:
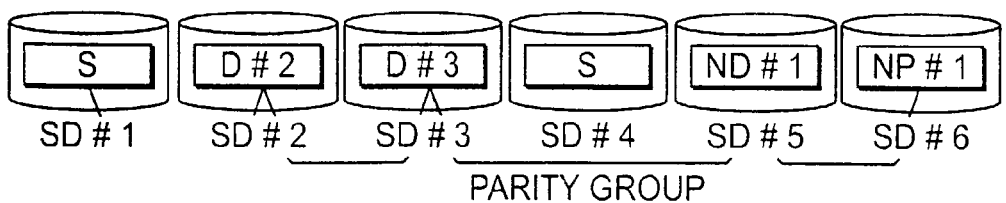

As shown in FIG. 4C, if after the new parity (NP#1) for the data (D#2, D#3, ND#1) in the SCSI drives 12 of SD#2, SD#3, and SD#5 has been written in the SCSI drive 12 of SD#6, one of the SCSI drives 12 of SD#2, SD#3, and SD#5 fails, then the data in the failed SCSI drive 12 can be rebuilt by using the data in the other SCSI drives 12 and the parity in the SCSI drive 12 of SD#6.

For example, if a failure occurs at the SCSI drive 12 of SD#2, the data (D#2) in this SCSI drive 12 can be rebuilt by using the data (D#3 and ND#1) in the SCSI drives 12 of SD#3 and SD#4 and the parity in the SCSI drive 12 of SD#6.

According to the present invention, in the write process, new data is duplicately and temporarily stored in the space fields, and at this stage a tentative write completion is reported to CPU 1. CPU 1 therefore requires a write process time equal to the time while the duplicate data is written in SCSI drives. A conventional disk array requires an average latency time of 1.5 revolution during the write process as shown in FIG. 12A. However, according to the present invention, an average latency time becomes 0.5 revolution if the rotation of the SCSI drives 12 constituting the logical group 10 are synchronized. Furthermore, even if a failure occurs at a SCSI drive of a logical group prior to writing the new parity into a SCSI drive, a failure recovery is possible like a conventional disk array by using the old parity and duplicate new data.

In this embodiment, data, a parity, and space fields in the SCSI drives 12 of a logical unit at the same SCSI Inter-Addr 44 are used. However, data, a parity, and space fields at different SCSI Inter-Addr 44 may be used by adding the addresses of respective logical groups 10 to the logical address 45, parity drive number 50, and space drive number 51 of the address table 40.

In the embodiment, in order to shorten a latency time during the write process, new data is temporarily and duplicately stored in SCSI drives, and at a later proper timing, the parity is updated. After the parity has been updated, one of the duplicate data is released. According to the present invention, apart from the above-described performance improvement, the following application is possible.

Although the reliability obtained by using data duplication requires a larger storage capacity, it is higher than the reliability obtained by using a parity. The application of this invention uses this feature. The reliability of the new data and the data frequently written data is made high by using data duplication, whereas the reliability of the data not frequently written is ensured by using a parity with a smaller storage capacity. Specifically, the reliability of the data not frequently written is ensured by using a parity although it ,is not so high as data duplication, whereas the reliability of the new data and the data frequently written is made high by using data duplication although the larger storage capacity is required. In this manner, two reliability levels can be set.

A second embodiment of the present invention will be described with reference to FIG. 6. In the rebuilding process of the first embodiment, data is rebuilt and stored by replacing a failed SCSI drive by a normal SCSI drive or by switching the failed SCSI to a reserved SCSI drive. In the second embodiment having the same drive array system of the first embodiment, if a failure occurs at a SCSI drive 12, data in the failed drive is rebuilt, and space fields are used for storing the rebuilt data.

According to the present invention, as shown in FIG. 3A, a parity group is constituted by data at the same SCSI Inter-Addr 44 in the SCSI drives 12 of a logical group. Specifically, PG 36 generates a parity (P#1) by using Data#1, Data#2, and Data#3 (D#1, D#2, D#3) in the SCSI drives 12 of SD#1, SD#2, and SD#3, and stores it in the SCSI drive 12 of SD#5. In this embodiment, an odd parity is used so that if the number of 1 s of the bits of Data#1, Data#2, and Data#3 (D#1, D#2, D#3) is odd, a parity "0" is used, and if the number is even, a parity "0" is used (exclusive logical sum). If a failure occurs at the SCSI drive 12 of SD#1, Data#1 (D#1) cannot be read therefrom.

In this embodiment, a single parity per one parity group is used. Therefore, data can be rebuilt if one SCSI drive 12 fails. However, if another SCSI drive 12 fails before the data is rebuilt, this data cannot be rebuilt. In such a case, prior to the occurrence of a failure at the second SCSI drive 12, Data#2 and Data#3 and Parity#1 (P#1) are transferred to the cache memory 7. MP1 20 instructs PG 36 to execute the data building process at once. In this case, MP1 20 is required to update a parity for the new data in the logical group 10, to release one of the duplicate data, and to allow the rebuilt data to be written in the space field. After Data#1 (D#1) is rebuilt, MP1 20 stores Data#1 in the SCSI drive of SD#4 or SD#5.

In the above manner, the space fields can be used either for shortening the write latency time as in the case of the first embodiment, or for storing the rebuilt data upon occurrence of a failure of a SCSI drive 12. After MP1 20 has stored the rebuilt Data#1 (D#1) in the space field, the space drive number 51 for the stored rebuilt Data#1 (D#1) in the address table 40 shown in FIG. 3B and stored in the cache memory 7 is deleted, and the contents of the logical address 45 of the rebuilt Data#1 (D#1) are copied to the logical address 45 corresponding to the deleted drive number.

Figure 6:
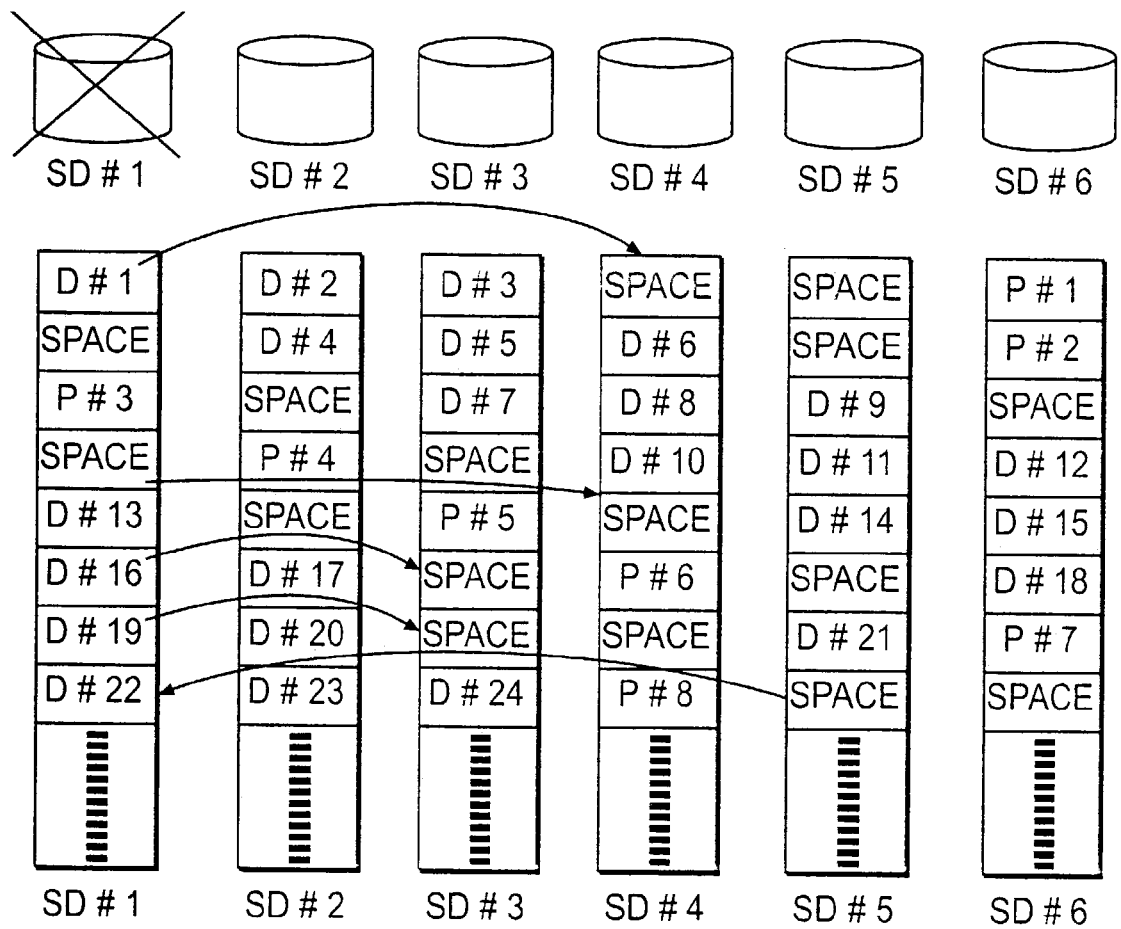
FIG. 6 is a schematic diagram explaining the operation of a data rebuilding process and the positions of data and parity constituting a parity group according to a second embodiment of the present invention.

As shown in FIG. 6, the SCSI drive 12 of SD#1 stores Data#1 (D#1) as well as the parity and Data#13, Data#16, Data#19, and Data#22 (D#13, D#16, D#19, D#22). The space fields are not necessary to be rebuilt. The Parity#3 (P#3) is rebuilt from Data#7, Data#8, and Data#9 (D#7, D#8, D#9) in the SCSI drives 12 of SD#3, SD#4, and SD#5 and stored in the space field of the SCSI drive 12 of SD#2 or SD#6. Data#13 is rebuilt from Data#14 and Data#15 (D#14, D#15) and Parity#5 (P#5) in the SCSI drives 12 of SD#3, SD#5, and SD#6, and stored in the space field of the SCSI drive 12 of SD#2 or SD#4. Data#16 is rebuilt from Data#17 and Data#18 (D#17, D#18) and Parity#6 (P#6) in the SCSI drives 12 of SD#2, SD#4, and SD#6, and stored in the space field of the SCSI drive 12 of SD#3 or SD#5. Similarly, Data#19 and Data#22 are rebuilt and stored in the space fields in the logical groups.

After the rebuilt data of the SCSI drive 12 has been stored in the space fields of the SCSI drives 12 of SD#2, SD#3. SD#4. SD#5, and SD#6, each logical group has one space field. Therefore, the write latency time cannot be shortened as in the first embodiment so that the conventional disk array process of RAID of the level 5 is performed. If after the data in the SCSI drive 12 of SD#1 has been rebuilt and stored, another SCSI drive 12 among the SCSI drives 12 of SD#2, SD#3, SD#4, SD#5, and SD#6 fails, the data in the failed SCSI drive 12 can be rebuilt in the manner described above.

If all the space fields of the logical groups are used, the failed SCSI drives are replaced by normal SCSI drives 12 whose fields are all used as space fields in configuring logical groups.

When the failed SCSI drives are replaced by the normal SCSI drives, space fields are initially concentrated upon particular SCSI drives. As a result, it becomes often to wait the use of these SCSI drives so that the effects of shortening the latency time as in the first, embodiment cannot be efficiently performed. However, as time lapses, the space fields are dispersed to restore the normal state, gradually solving the above problem. If this restoration time poses any practical problem, the failed SCSI drive 12 may be replaced by a normal SCSI drive each time a failure occurs so that a user can rebuild the data and parity in the failed SCSI drive and store them in the replaced normal SCSI drive. In this case, the space fields are not rebuilt and are reserved as the space fields themselves.

In this embodiment, MP1 20 performs the rebuilding process and a process of writing the rebuilt data in the space field. Accordingly, as compared to the case where a failed SCSI drive is replaced by a normal SCSI drive and the rebuilt data is written therein, a burden on a user can be reduced because the user of this system is not necessary to replace the failed SCSI drive by a normal SCSI drive immediately when a failure occurs.

A third embodiment of the present invention will be described with reference to FIGS. 7 to 11.

Figure 7:
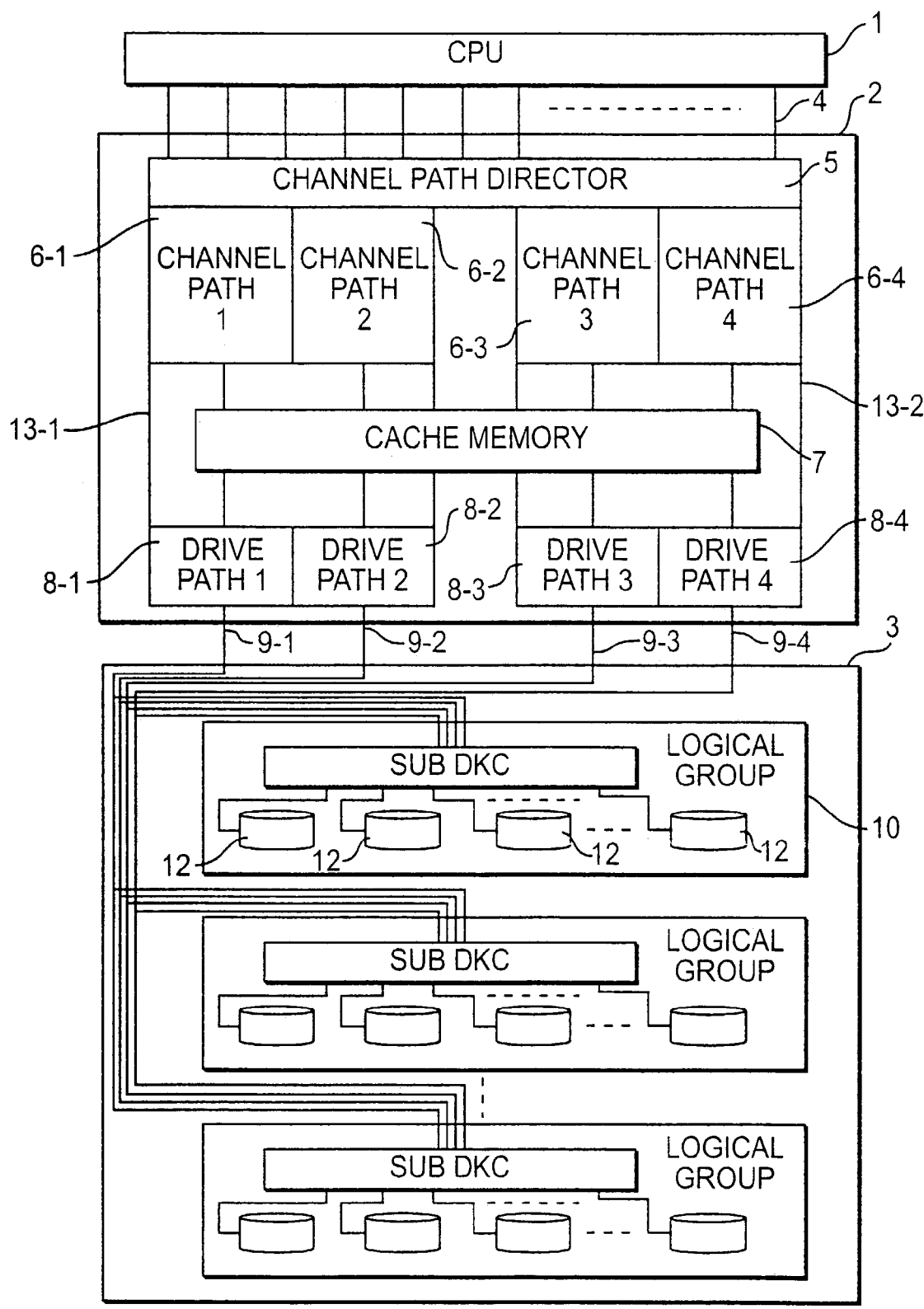
FIG. 7 is a schematic diagram showing the overall structure of a disk array structure according to a third embodiment of the present invention.
Figure 8:
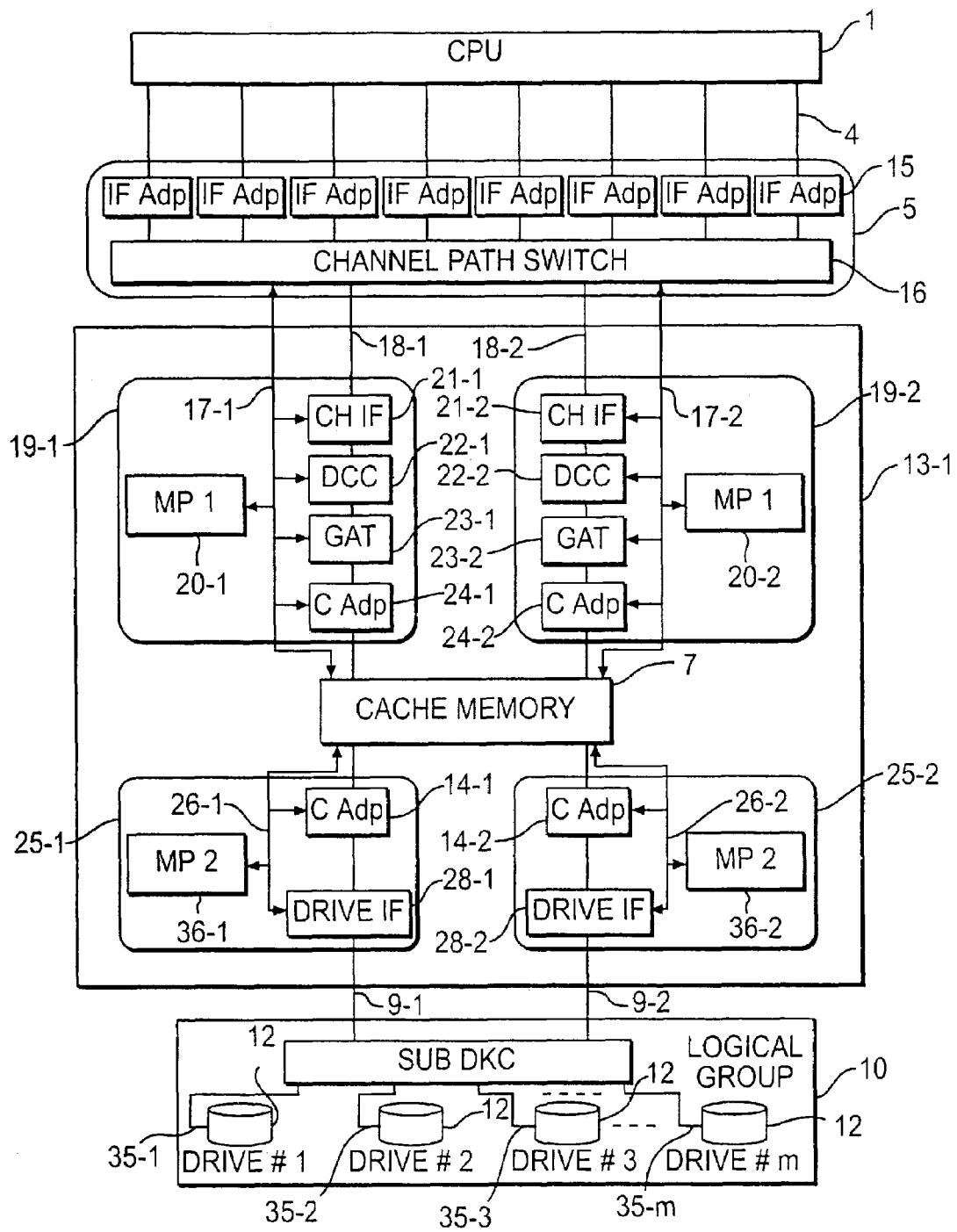
FIG. 8 is a schematic diagram showing the internal structure of the cluster of the third embodiment.

In this embodiment, as shown in FIGS. 7 and 8, each logical group 10 has a subsidiary DKC 11 which has a microprocessor MP3 29 for controlling the address table 40 in the cache memory 7 in the first and second embodiments, RPC 27, PG 36, and a sub-cache 32. The data processing procedure of this embodiment is similar to the first and second embodiments.

Figure 9:
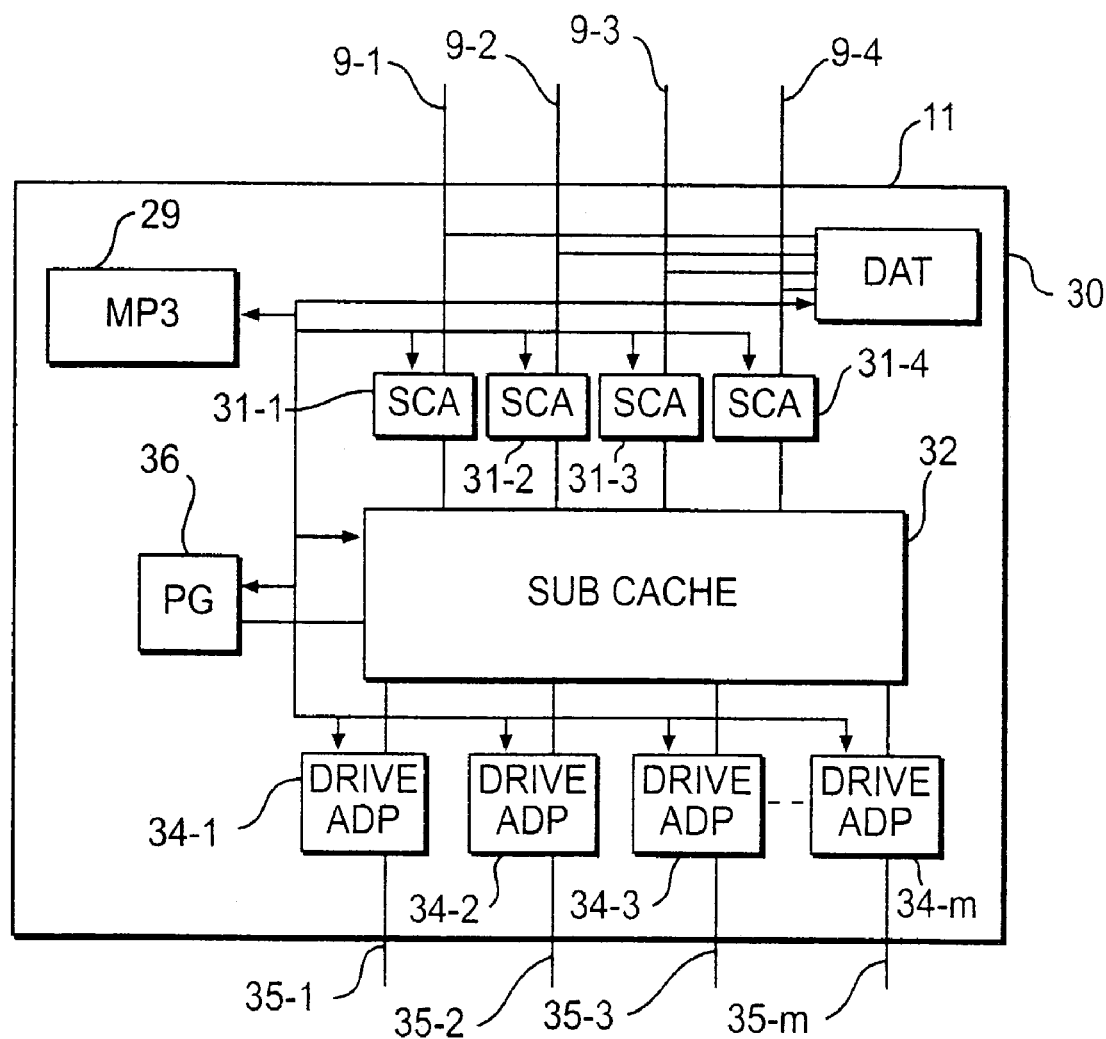
FIG. 9 is a block diagram showing the subsidiary DKC of the third embodiment.

Only the procedure of the third embodiment different from the first and second embodiment will be described with reference to FIGS. 10 and 11. As shown in FIG. 9, in the third embodiment, the address table 40 in the cache memory 7 of the first and second embodiments is stored as a data address table (DAT) 30 in the subsidiary DKC 11. The format and function of DAT 30 are the same as the first and second embodiments. The different points are that the SCSI drive address 42 at which data is stored is limited only to the logical group 10 and that a dedicated memory for storing DAT 30 is used separately from the cache memory 7 storing the address table 40. GAT 23 in ADC 2 judges from a CPU designated address only whether or not the location indicated by a CPU designated address is which logical group 10 of ADU 3. A logical group table (LGT) 60 such as shown in FIG. 10 is stored in the cache memory 7 at a particular region thereof.

As shown in FIG. 10, LGT 60 is a table by which a logical group address 61 can be determined from the CPU designated drive number 41 and CCHHR 46 supplied from CPU 1. LGT 60 stores a cache address 47 of a data location in the cache memory 7, and has a cache flag 48 which turns on ("1") if data is present in the cache memory 7 and turns off ("0") if data is not present in the cache memory 7. At the initial settings, a user designates the storage region of a usable capacity. At this time, MP1 20 of ADC 2 assigns logical groups 10 by using LGT 60. MP1 20 registers the storage region in LGT 60, the storage region corresponding to a CPU designated address entered by a user.

In an actual read/write process, GAT 23 can recognize a logical group 10 corresponding to the CPU designated address by referring to LGT 60. In a read process, GAT 23 identifies a logical group by referring to LGT 60 and supplies the information of the identified logical group to MP1 20. MP1 20 instructs Drive-IF 28 to issue a read request to the logical group 10. Drive-IF 28 instructed by MP1 20 supplies the read request and CPU designated address to the subsidiary DKC 11 of the logical group 10. The microprocessor MP3 29 of the subsidiary DKC 11 receives the read request command and CPU designated address. Like the first embodiment, DKC 11 refers to DAT 30 and translates the CPU designated address supplied from Drive-IF 28 into a logical address 45 of the logical group 10 storing the subject data. In accordance with the logical address 45, the SCSI drive address 42 (SCSI drive number 43 and SCSI Inter-Addr 44) is identified.

After the SCSI drive address 42 is identified, a read request is issued to the SCSI drive 12. The SCSI drive 12 received the read request from MP3 29 performs an access process including a seek and latency to SCSI Inter-Addr 44. Then it becomes possible to read the data, the data is read and transferred to Drive-Adp 34 which stores it in the sub-cache memory 32. After the data has been stored in the sub-cache memory 32, Drive-Adp 34 reports a storage completion to MP3 29 which in turn turns on ("1") the cache flag 48 in DAT 30 at the logical address 45 of the data. Similar to the first embodiment, if a read/write request is issued later to the data having the cache flag 48 of on ("1"), MP3 29 informs a data transfer permission to Drive-IF 28 of ADC 2, and Drive-IF 28 responds to this and supplies information to MP1 20.

Upon reception of this information, MP1 20 instructs Drive-IF 28 to transfer the data to the subsidiary DKC 11 if the data can be stored in the cache memory 7. In response to this instruction, Drive-IF 28 issues a read request to MP3 29 of the subsidiary DKC 11. In response to this read request, MP3 29 instructs the sub-cache adapter (SCA) 31 to read the data from the sub-cache memory 32. SCA 31 reads the data and transfers it to Drive-IF 28. After Drive-IF 28 receives the data, the similar processes to the first and second embodiments are performed.

Similar to the write process, in the read process, the logical group 10 is identified, and MP1 20 instructs Drive-IF 28 to issue a write request to MP 3 29 of the logical group 10. After MP3 29 of the logical group 10 receives the write request and stores the data in the sub-cache memory 32, the processes similar to the first and second embodiments are executed in accordance with the flow chart of FIG. 5. The third embodiment can also attain the advantageous effects of the first and second embodiments.

Although a system using magnetic disks has been described in the above embodiments, the present invention is applicable to a system using optical disks with the same advantageous effects.

According to the present invention, it is possible to delay a parity update process in the data write process until the number of read/write requests by CPU becomes small. Accordingly, CPU can execute a write process at a high speed when there are a number of read/write requests, thereby increasing the number of I/O processes per unit time. Furthermore, a reserved SCSI drive not usually used can be used to improve the performance of shortening a latency time, thereby allowing the SCSI drive resources to be efficiently used.

What is claimed is:

1. A data storing method for a storage system having a storage for storing data inputted from an external device and outputting stored data to the external device, comprising the steps of:

temporarily storing data, which is to be stored in said storage, into a cache memory, said data being inputted and outputted between said storage system and an external device connected to said storage system;

writing said data that is stored in said cache memory into a first area of said storage in a form of a first redundancy level;

detecting a predetermined condition with respect to a frequency of input/output between said storage system and said external device;

in response to detection of said predetermined condition, writing the data which are stored in the first area into a second area of said storage in a form of a second redundancy level, and after storing said data into the second area, making said data in the first area invalid, thereby releasing said first area for a subsequent write process.

2. A data storing method according to claim 1, wherein the form of said first redundancy level utilizes duplication and the form of said second redundancy level utilizes parity.

3. A data storing method according to claim 1, wherein said storage is comprised of a plurality of disks.

4. A storage system, comprising:

a storage for storing data, and a controller for controlling said storage, wherein said controller has a cache memory for temporarily storing data which is to be stored in said storage, said data being inputted and outputted between said controller and an external device connected to said controller, wherein said controller writes said data that is stored in the cache memory into a first area of said storage in a form of a first redundancy level, detects a predetermined condition with respect to a frequency of input/output between said controller and said external device, and in response to detection of said predetermined condition, writes said data which are stored in the first area into a second area of said storage in a form of a second redundancy level, and wherein after writing said data into the second area, said data in the first area is made invalid, thereby releasing said first area for a subsequent write process.

5. A storage system according to claim 4, wherein the form of said first redundancy level utilizes duplication and the form of said second redundancy level utilizes parity.

6. A storage system according to claim 4, wherein said storage is comprised of a plurality of disks.

7. A storage system, comprising:

a plurality of storage areas for storing data, comprised of a plurality of disks; and a controller for controlling said storage areas, wherein said controller has a cache memory for temporarily storing data which is to be stored in one or more of said storage areas, said data being inputted and outputted between said controller and an external device connected to said controller, wherein said controller writes said data that is stored in said cache memory into a first storage area of said plurality of storage areas in a form of a first redundancy level, detects a predetermined condition with respect to a frequency of input/output between said controller and said external device, and in response to detection of said predetermined condition, writes the data which are stored in the first storage area into a second storage area of said plurality of storage areas in a form of a second redundancy level, and wherein after writing said data into the second area, said data in the first area is made invalid, thereby releasing said first storage area for a subsequent write process.

8. A storage system according to claim 7, wherein the form of said first redundancy level utilizes duplication and the form of said second redundancy level utilizes parity.

* * * * *